(12) United States Patent
Asmussen et al.

(10) Patent No.: US 8,316,797 B2
(45) Date of Patent: Nov. 27, 2012

(54) MICROWAVE PLASMA REACTORS

(75) Inventors: Jes Asmussen, East Lansing, MI (US); Timothy Grotjohn, Okemos, MI (US); Donnie K. Reinhard, East Lansing, MI (US); Thomas Schuelke, Brighton, MI (US); M. Kagan Yaran, Lansing, MI (US); Kadek W. Hemawan, East Lansing, MI (US); Michael Becker, East Lansing, MI (US); David King, Lansing, MI (US); Yajun Gu, Lansing, MI (US); Jing Lu, East Lansing, MI (US)

(73) Assignee: Board of Trustees of Michigan State University Fraunhofer USA, East Lansing, Plymouth, MI (US)

( * ) Notice: Subject to any disclaimer, the term of this patent is extended or adjusted under 35 U.S.C. 154(b) by 507 days.

(21) Appl. No.: 12/456,388

(22) Filed: Jun. 16, 2009

(65) Prior Publication Data

US 2010/0034984 A1 Feb. 11, 2010

Related U.S. Application Data

(60) Provisional application No. 61/132,179, filed on Jun. 16, 2008, provisional application No. 61/268,061, filed on Jun. 8, 2009.

(51) Int. Cl.
 *C23C 16/00* (2006.01)
 *C23F 1/00* (2006.01)
 *H01L 21/306* (2006.01)
(52) U.S. Cl. . 118/723 MW; 118/723 ME; 118/723 MR; 156/345.35; 156/345.36; 156/345.41
(58) Field of Classification Search .......... 118/723 MW, 118/723 ME, 723 MR; 156/345.41, 345.35, 156/345.36
 See application file for complete search history.

(56) References Cited

U.S. PATENT DOCUMENTS

| | | | |
|---|---|---|---|
| 3,762,794 A | | 10/1973 | Arnaud |
| 4,940,015 A | | 7/1990 | Kobashi et al. |
| 4,943,345 A | * | 7/1990 | Asmussen et al. .............. 216/69 |
| 5,311,103 A | | 5/1994 | Asmussen et al. |
| 5,571,577 A | | 11/1996 | Zhang et al. |
| 5,611,864 A | | 3/1997 | Kimura et al. |
| 5,645,645 A | | 7/1997 | Zhang et al. |
| 5,804,033 A | * | 9/1998 | Kanai et al. ..................... 216/69 |
| 6,057,645 A | * | 5/2000 | Srivastava et al. ....... 315/111.21 |

(Continued)

OTHER PUBLICATIONS

T. A. Grotjohn and J. Asmussen, "Microwave Plasma—Assisted Diamond Synthesis over Large Areas at High Rates," Invited Paper, presented at the 7th International Workshop, Strong Microwaves: Sources and Applications Jul. 27-Aug. 2, 2008, Nizhny Novgorod, Russia.

(Continued)

*Primary Examiner* — Rakesh Dhingra
(74) *Attorney, Agent, or Firm* — Dickinson Wright PLLC

(57) ABSTRACT

New and improved microwave plasma assisted reactors, for example chemical vapor deposition (MPCVD) reactors, are disclosed. The disclosed microwave plasma assisted reactors operate at pressures ranging from about 10 Torr to about 760 Torr. The disclosed microwave plasma assisted reactors include a movable lower sliding short and/or a reduced diameter conductive stage in a coaxial cavity of a plasma chamber. For a particular application, the lower sliding short position and/or the conductive stage diameter can be variably selected such that, relative to conventional reactors, the reactors can be tuned to operate over larger substrate areas, operate at higher pressures, and discharge absorbed power densities with increased diamond synthesis rates (carats per hour) and increased deposition uniformity.

23 Claims, 23 Drawing Sheets

U.S. PATENT DOCUMENTS

| | | | | |
|---|---|---|---|---|
| 6,072,167 | A | * | 6/2000 | Lewis et al. ............... 219/690 |
| 6,077,787 | A | | 6/2000 | Reinhard et al. |
| 6,622,650 | B2 | * | 9/2003 | Ishii et al. ............ 118/723 MW |
| 7,166,170 | B2 | * | 1/2007 | Fink ........................... 118/733 |
| 2002/0122757 | A1 | | 9/2002 | Chung et al. |
| 2003/0152700 | A1 | * | 8/2003 | Asmussen et al. ......... 427/249.8 |
| 2003/0178143 | A1 | | 9/2003 | Perrin |
| 2005/0202173 | A1 | * | 9/2005 | Mills ....................... 427/249.7 |

OTHER PUBLICATIONS

M. Kamo, H. Yurimuto, Y. Sato, Appl. Surf. Sci. 33/44, 553 (1988).

T. Teraji, Phys. Stat. Sol.(a) 203, 3324-3357 (2006).

T. S. McCauley and Y. K. Vohra, Appl. Physics. Lett. 66, 1486 (1995).

D.King, M.K.Yaran, T. Schuelke, T.A. Grotjohn, D. K. Reinhard and J.Asmussen, Diamond and Related Materials 17 (2008) 520-524.

C.-S. Yan, Y. K. Vohra, H.-K. Mao, and R. L. Hemley, Proc. Natl. Acad. Sci. U. S. A. 99, 12523 (2002).

K.P. Kuo and J. Asmussen, Diamond Relat. Mater. 6 (1997) 1097.

Y. Mokuno, A. Chayahara, Y. Soda, Y. Horino, N. Fujimori, Diamond Relat. Mater. 14 (2005) 1743.

A. Tallaire, J. Acharda, F. Silvaa, R.S. Sussmanna, A. Gicquel, Diamond Relat. Mater. 14, (2005) 249.

H. Sternschulte, T. Bauer, M. Schreck, B. Stritzker, Diamond Relat. Mater. 15 (2006) 542.

H. Yamada, A. Chayahara, Y. Mokuno, S. Shikata, Diamond Relat. Mater. (2007).

H. Yamada, A. Chayahara, Y. Mokuno, S. Shikata, Diamond Relat. Mater. 17 (2008) 1062.

H. Yamada, A. Chayahara, Y. Mokuno, Y. Horino, S. Shikata, Diamond Relat. Mater. (2006).

H. Yamada, A. Chayahara, Y. Mokuno, Y. Horino, S. Shikata, Diamond Relat. Mater. 15, (2006) 1389.

K. W. Hemawan, T. A. Grotjohn, D. K. Reinhard, J. Asmussen, invited paper presented at ICOPS 2008, Karlsruhe Germany Jun. 2008.

J. Asmussen, R. Mallavarpu, J. R. Hamann, and H. C. Park, Proceed. IEEE, 62, (1974), 109.

R. Mallavarpu, M.C. Hawley and J. Asmussen, IEEE Trans. On Plasma Sci., PS-6, (1978), 341.

S. S. Zuo et al. Diamond Relat. Mater. 17 (2008) 300.

S. Whitehair, and J. Asmussen, J. Propulsion and Power, 3, (1987), 136-144.

S. Offermans, Electrodless High-power Microwave Discharges, J Appl Phys. 67, 115 (1990).

J.E Brandenburg, J.Kline, D. Sulliven, IEEE Trans. On Plasma Science 33, 2, 776-782, pt2 Apr. 2005.

K.D. Diament, B. L. Ziegler, R. B. Cohen, J. of Propulsion and Power, 23, 27-34, Jan.-Feb. 2007.

T.A. Grotjohn, J. Asmussen, J. Sivagnaname, D. Story, A.L. Vikharev, A. Gorbachev, A, Kolysko, Diamond Relat. Mater. 9 (2000) 322.

A. L. Vikharev, A.M. Gorbachev, A.V. Kolysko, D. B. Radishev, and A. B. Muchnikov, Diamond Relat. Mater. 17 (2008) 1055.

Y. Gu, J. Lu, K.W. Hemawan, T.A. Grotjohn, D.K. Reinhard, and J. Asmussen, "Microwave Plasma-assisted Reactor Design for High Power Densities, Large Deposition," Presented at the New Diamond and Nano Carbons Conference, Traverse City, Michigan, Jun. 7-11, 2009.

K.W. Hemawan, T.A. Grotjohn, D.K. Reinhard and J. Asmussen, "High Pressure Microwave Plasma Assisted CVD Synthesis of Diamond," Presented at the New Diamond and Nano Carbons Conference, Traverse City, Michigan, Jun. 7-11, 2009.

J. Lu, K.W. Hemawan, Y. Gu, T.A. Grotjohn, D.K. Reinhard and J. Asmussen, "High Pressure Single Crystal Diamond Synthesis With Nitrogen Addition by MPACVD," Presented at the New Diamond and Nano Carbons Conference, Traverse City, Michigan, Jun. 7-11, 2009.

International Search Report and Written Opinion, PCT/US2012/037555, filed May 11, 2012.

* cited by examiner

MICROWAVE PLASMA REACTORS

CROSS-REFERENCE TO RELATED APPLICATION

This application claims the priority benefit of U.S. Provisional Applications No. 61/132,179, filed Jun. 16, 2008, and 61/268,061 filed Jun. 8, 2009, which are incorporated herein by reference in their entirety.

BACKGROUND OF THE DISCLOSURE

1. Field of the Disclosure

The disclosure relates to the development of new and improved microwave plasma assisted reactors, for example chemical vapor deposition (MPCVD) reactors. Relative to conventional microwave plasma assisted reactors, the reactors according to the disclosure operate over larger substrate areas, operate at higher pressures, and operate at higher discharge absorbed power densities with the goal toward increased diamond synthesis rates (carats per hour) and increased deposition uniformity.

2. Brief Description of Related Technology

Early investigations of chemical vapor deposition (CVD) of diamond employed low power density microwave discharges/reactors (i.e., <5 $W/cm^3$) that were operated within the low-pressure regime (i.e., 20 Torr to 100 Torr) and used 1%-5% $CH_4/H_2$ input gas mixtures [1, 2]. Both polycrystalline and single crystal films were synthesized with deposition rates that increased from less than 1 µm/h at very low methane concentrations (<1%) to a maximum of a few micron/hour as methane concentrations were increased to 5%. However, high-quality films could only be produced under low methane input conditions (<1%) and, as a result, diamond growth rates were very low (i.e., less than about 1 µm/h). Attempts to increase the growth rate by increasing the input methane concentrations led to the formation of defects such as secondary nucleation and unepitaxial crystallites. While these results were of scientific interest [2], the very low growth rates limited the commercial potential of microwave plasma assisted CVD (MPCVD) synthesis of diamond. Thus, in the mid 1990's, an important scientific and engineering challenge and opportunity that remained unsolved was to discover and develop diamond synthesis methods that dramatically increase the deposition rates while still producing excellent crystalline quality.

During the mid 1990's and early 2000's, several research groups [3, 5-7] searched for improved diamond synthesis methods. Their experiments, which synthesized both polycrystalline and single crystalline materials, utilized high power density (i.e., 50 $W/cm^3$ to 100 $W/cm^3$) microwave discharges operating at moderate pressures between 100 Torr and 180 Torr. Good quality polycrystalline diamond (PCD) was deposited at 4 µm/h to 10 µm/h [6-7] and single crystalline diamond (SCD) was produced at rates of 50 µm/h to 100 µm/h with the addition of nitrogen to enhance the deposition rate [3, 5]. These growth rates were higher by a factor of 5 to 100 times than the growth rates for good quality CVD-synthesized diamond that was obtained in the early 1990's using low pressure microwave discharges.

U.S. application Ser. No. 12/381,270 to Asmussen et al., incorporated herein by reference, relates to a microwave plasma deposition process and apparatus for producing diamond, preferably as single crystal diamond (SCD). The process and apparatus enables the production of multiple layers of the diamond by the use of an extending device to increase the length and the volume of a recess in a holder containing a SCD substrate as layers of diamond are deposited.

Objects

One of the objects is to provide an apparatus and methods for the microwave plasma assisted deposition of diamond that are able to provide both increased deposition rates and excellent crystalline quality for polycrystalline and single crystal diamond. These and other objects may become increasing apparent by reference to the following description.

SUMMARY

Microwave plasma assisted synthesis of diamond is disclosed using high purity input gas chemistries (e.g., about 2 mol. % to about 5 mol. % $CH_4$ relative to $H_2$) and high operating pressures (e.g., about 180 Torr to about 260 Torr). A microwave cavity plasma reactor (MCPR) was designed to be experimentally adaptable and tunable to enable operation with high input microwave plasma absorbed power densities within the higher pressure regime. The reactor design produced intense microwave discharges with variable absorbed power densities of about 150 $W/cm^3$ to about 550 $W/cm^3$ and allowed the control of the plasma discharge (e.g., size, shape), thereby allowing for process optimization. Uniform polycrystalline diamond films were synthesized on 2.54 cm-diameter silicon substrates at substrate temperatures ranging from about 800° C. to about 1200° C. The deposition rates ranged from about 3 µm/h to about 21 µm/h (and higher) and increased as the operating pressure and the methane feed concentrations increased. Thick, transparent, freestanding diamond films were synthesized, and Raman and FTIR measurements indicated the synthesis of high quality diamond. Optical quality films were produced with methane concentrations as high as 4% and at growth rates of about 12 µm/h to about 14 µm/h. In particular, the experimental methane feed concentration range (or "methane window") in which high quality optical diamond films could be synthesized increased as pressure and power density increased, resulting in the synthesis of high quality diamond films at rates that were about 6 to about 7 times faster than the equivalent optical films grown at lower pressures and with lower absorbed power densities. Single crystal diamond films also were synthesized on 3.5 mm×3.5 mm single crystal diamond seed substrates at substrate temperatures ranging from about 950° C. to about 1250° C. and at deposition rates ranging from about 8 µm/h to about 13 µm/h with a 3% $CH_4/H_2$ feed. With the addition of small amounts of a nitrogen source gas to 5% $CH_4/H_2$ feed, deposition rates increase up to about 75 µm/h and beyond.

Growth rates can be increased by carrying out the deposition process at operating pressures above 100 Torr and by using high power density microwave discharges [8-12]. It is speculated that by increasing the deposition pressure beyond 180 Torr and by increasing the discharge power density, that diamond growth rates can be increased considerably further while yielding good quality diamond. Research groups [11-16] are exploring new designs and process methods for higher pressure and higher power density MPACVD machines.

The apparatus and methods disclosed herein are directed to the MPCVD diamond synthesis at high pressures (e.g., about 180 Torr and above) and at high discharge power densities (e.g., about 150 $W/cm^3$ and above). A specific generic reactor geometry [6, 21] is identified as the microwave cavity plasma reactor (MCPR). When operated in the 100 Torr to 160 Torr pressure regime this reactor has synthesized high quality and high growth rate CVD polycrystalline diamond material [6, 7, 20, 21]. In this disclosure, an improved reactor is designed to operate with high power densities at pressures of about 180 Torr and above. The improved reactor is experimentally characterized over a high pressure regime by synthesizing PCD and SCD films.

Disclosed herein is a microwave plasma assisted reactor comprising: (a) a first microwave chamber having a reference plane at a reference axial location $Z_0$, the first microwave chamber comprising an electromagnetic wave source and extending in an axial direction $z > Z_0$; (b) a plasma chamber having an outer wall, the plasma chamber extending into the first microwave chamber such that at least a portion of the plasma chamber is located at $z > Z_0$ and at least a portion of the plasma chamber is located at $z < Z_0$ (e.g., the microwave chamber and a base portion of the plasma chamber are structurally coupled at the $Z_0$ plane); (c) a conductive stage having a reference surface extending into the plasma chamber and defining a second microwave chamber in the plasma chamber (i) at $z < Z_0$ (or at axial positions below the reference surface) and (ii) between the plasma chamber outer wall and the conductive stage; (d) a conducting short disposed (e.g., adjustably disposed) in the second microwave chamber and in electrical contact with the plasma chamber outer wall and the conductive stage, the axial distance between the conducting short and $Z_0$ being L2, and the axial distance between the conducting short and the reference surface of the conductive stage being L1; wherein L2 and L1 are capable of adjustment in the reactor by moving the conducting short, such that different microwave modes are produced in the first microwave chamber (e.g., at $z > Z_0$) and in the second microwave chamber (e.g., at $z < Z_0$) during operation of the reactor. During operation of the reactor, evanescent microwave fields generally are produced in the vicinity of $Z_0$, and the evanescent microwave fields are distinct from the microwave modes in the first microwave chamber and in the second microwave chamber. In a refinement, the conductive stage is movable such that both L1 and L2 are capable of independent adjustment during operation of the reactor by moving one or both of the conducting short and the conductive stage. For example, one or both of the conducting short and the conductive stage can be slidable in an axial direction. In an embodiment, the first microwave chamber, the plasma chamber, and the conductive stage have a cylindrical cross section (e.g., with radii of R1, R2, and R3, respectively), although other geometric cross sections are possible (e.g., square, rectangular). The ratio R3/R2 is suitably about 0.5 (or 0.4, 0.3, or 0.2) or less and/or about 0.05 (or 0.1 or 0.2) or more. The reactor is capable of producing a plasma having a power density ranging from about 160 W/cm³ to about 600 W/cm³ in the plasma chamber when the electromagnetic wave source provides an excitation frequency of about 2.45 GHz and an operating pressure in the plasma chamber ranges from about 180 Torr to about 260 Torr.

In another embodiment, a microwave plasma assisted reactor comprises: (a) a cylindrical chamber defining an interior cylindrical microwave chamber of radius R1 and having (i) a central axis, (ii) a lower boundary at a reference axial location $Z_0$, and (iii) a upper boundary at an axial location $Z_U > Z_0$; and (b) a base defining an interior base cavity of radius R2 and having (i) an upper boundary adjacent the cylindrical chamber at $Z_0$ and (ii) a lower portion extending axially downwardly in a direction $z < Z_0$; (c) an upper conducting short in electrical contact with the cylindrical chamber and disposed in an upper portion of the cylindrical chamber at an axial distance $L_s$ above $Z_0$, the upper conducting short having a central opening and defining the upper boundary of the cylindrical chamber; (d) an excitation probe extending through the central opening of the upper conducting short and into the upper portion of the cylindrical microwave chamber by an axial distance $L_p$ relative to the upper boundary of the cylindrical chamber; (e) a coaxial stage having a radius R3 and an upper surface extending at least into the base cavity and optionally into a bottom portion of the cylindrical microwave chamber, the coaxial stage defining a coaxial microwave chamber between R3 and R2 in the base cavity; (f) a lower conducting short adjustably disposed in the coaxial microwave chamber below $Z_0$ and in electrical contact with the base and the coaxial stage, the axial distance between the lower conducting short and $Z_0$ being L2 and the axial distance between the lower conducting short and the upper surface of the coaxial stage being L1; (g) a quartz bell jar mounted on the base and defining a plasma chamber in the bottom portion of the cylindrical microwave chamber and the coaxial microwave chamber; (h) a feed gas inlet in fluid connection with the plasma chamber; and, (i) an effluent gas outlet in fluid connection with the plasma chamber; wherein L2 and L1 are capable of adjustment in the reactor by moving the lower conducting short. The ratio R3/R2 is suitably about 0.5 (or 0.4, 0.3, or 0.2) or less and/or about 0.05 (or 0.1 or 0.2) or more.

Various refinements to the reactor are possible. In an embodiment, the coaxial stage is movable such that both L1 and L2 are capable of independent adjustment during operation of the reactor by moving one or both of the lower conducting short and the coaxial stage. In another embodiment, the lower conducting short has an annular disk shape and is slidable in an axial direction; suitably, the coaxial stage is movable and slidable in the axial direction as well. The reactor can additionally comprise (h) one or more shim inserts axially interposed between the base and the lower conducting short; wherein the lower conducting short has a disk shape and is adjustably located in an axial direction based on the number and size of shim inserts interposed between the base and the lower conducting short. Thus, both L1 and L2 can be independently adjusted in the reactor by independently selecting the number of shim inserts and the axial height of the coaxial stage (e.g., by selecting cylindrical stages of varying height, by selecting substrate holders of varying thickness). In an embodiment, at least one of the upper conducting short and the excitation probe (preferably both) is movable (e.g., slidable) and capable of (independent) adjustment during operation of the reactor.

In a suitable 2.45 GHz reactor, R1 ranges from about 6 cm to about 12 cm or 15 cm (e.g., about 6 cm to about 18 cm, about 8.9 cm); R2 ranges from about 5 cm to about 10 cm or 12 cm (e.g., about 5 cm to about 15 cm, about 7.0 cm); R3 ranges from about 0.5 cm to about 5 cm or 7 cm (e.g., about 0.5 cm to about 8 cm, about 0.95 cm, about 1.9 cm, or about 4.1 cm); $L_s$ ranges from about 15 cm to about 25 cm; $L_p$ ranges from about 2 cm to about 5 cm; and/or L1 and L2 independently range from about 4 cm to about 8 cm. At 2.45 GHz operating pressure can range from about 100 Torr to about 400 Torr (e.g., about 180 Torr to about 260 Torr) and the reactor power density can range from about 100 W/cm³ to about 1000 W/cm³ (e.g., about 160 W/cm³ to about 600 W/cm³) Alternatively, the operating pressure can range from about 50 Torr to about 150 Torr and the deposition area of the substrate having a deposition non-uniformity of 15% or less can range from about 6 cm to about 9 cm in diameter.

In a suitable 915 MHz reactor, R1 ranges from about 15 cm to about 25 cm (e.g., about 15 cm to about 40 cm, about 30 cm); R2 ranges from about 5 cm to about 30 cm (e.g., about 15 cm); R3 ranges from about 2 cm to about 20 cm (e.g., about 9.5 cm); $L_s$ ranges from about 40 cm to about 80 cm; and/or L1 and L2 independently range from about 10 cm to about 20 cm. At 915 MHz, the operating pressure can range from about 20 Torr to about 100 Torr and the deposition area of the substrate having a deposition non-uniformity of 15% or less can range from about 14 cm to about 20 cm in diameter. Alternatively, the operating pressure can range from about 100 Torr to about 160 Torr and the deposition area of the substrate having a deposition non-uniformity of 15% or less can range from about 10 cm to about 14 cm in diameter.

Also disclosed is a reactor kit including any of the above microwave plasma assisted reactors and at least one of: (a) a plurality of cylindrical chambers, each defining an interior cylindrical microwave cavity of a different radius $R_1$; (b) a plurality of bases, each defining an interior base cavity of a different radius $R_2$; and, (c) a plurality of coaxial stages, each having a different radius $R_3$; wherein the reactor can be assembled with any combination of the cylindrical chambers, the bases, and the coaxial stages such that at least one of $R_1$, $R_2$, and $R_3$ can be varied in a selected reactor assembly.

Also disclosed is a process for depositing a component on a substrate. The process comprises: (a) providing a microwave plasma assisted reactor according to any of the various embodiments, the reactor further comprising a deposition substrate mounted above an upper surface of the coaxial/conductive stage; (b) operating the reactor at a pressure ranging from about 10 Torr to about 760 Torr; (c) adjusting the axial position of the lower conducting short and optionally the coaxial stage the reactor to optimize at least one deposition property or condition (e.g., (i) a deposition area of the substrate having a deposition non-uniformity of 15% or less, (ii) a reactor power density, (iii) a component deposition rate, and/or (iv) substrate temperature); and, (d) depositing a component (e.g., single-crystal diamond or polycrystalline diamond (including microcrystalline or nanocrystalline)) on the substrate. Preferably, step (c) comprises adjusting the axial position of the (lower) conducting short and/or the conductive stage, for example during the operation of the reactor. When operating the reactor, a first electromagnetic mode $M_1$ (e.g., $TM_{013}$) in is generated in the first microwave chamber (e.g., cylindrical microwave chamber) of the reactor, a second electromagnetic mode $M_2$ (e.g., $TEM_{001}$) in is generated in the second microwave chamber (e.g., coaxial microwave chamber) of the reactor, and associated evanescent fields are formed in the vicinity of the deposition substrate, thereby forming a hybrid electromagnetic mode $M_3$ in the plasma chamber and in the vicinity of the deposition substrate. When the deposition component includes diamond, operating the reactor suitably includes feeding a source gas comprising hydrogen, methane, and optionally nitrogen, wherein the methane is present in the source gas in an amount ranging from about 1 mol. % to about 10 mol. % relative to hydrogen.

Also disclosed is a process for tuning a microwave plasma assisted reactor. The process comprises: (a) providing a microwave plasma assisted reactor according to any of the disclosed embodiments, the reactor further comprising a deposition substrate mounted above an upper surface of the conductive stage; (b) selecting a plurality of combinations of L1 and L2; (c) operating the reactor at each of the plurality of combinations of L1 and L2 and at a (pre-selected) pressure ranging from about 10 Torr to about 760 Torr to deposit a component on the substrate; (d) measuring one or more deposition properties (e.g., microwave power density, substrate temperature, deposition rate, and deposition uniformity) resulting from the operation of the reactor at each of the plurality of combinations of L1 and L2; and, (e) selecting a set of tuned L1 and L2 values based on the measured deposition properties in part (d). The plurality of combinations of L1 and L2 can be defined in various ways, for example such that L1 is held constant and L2 is parametrically varied over a plurality of values, L2 is held constant and L1 is parametrically varied over a plurality of values, and L1 and L2 are both parametrically varied over a plurality of values.

All patents, patent applications, government publications, government regulations, and literature references cited in this specification are hereby incorporated herein by reference in their entirety. In case of conflict, the present description, including definitions, will control.

Additional features of the disclosure may become apparent to those skilled in the art from a review of the following detailed description, taken in conjunction with the examples, drawings, and appended claims, with the understanding that the disclosure is intended to be illustrative, and is not intended to limit the claims to the specific embodiments described and illustrated herein.

BRIEF DESCRIPTION OF THE DRAWINGS

The patent or application file contains at least one drawing executed in color. Copies of this patent with color drawing(s) will be provided by the Patent and Trademark Office upon request and payment of necessary fee.

For a more complete understanding of the disclosure, reference should be made to the following detailed description and accompanying drawings wherein.

Figure 1A:
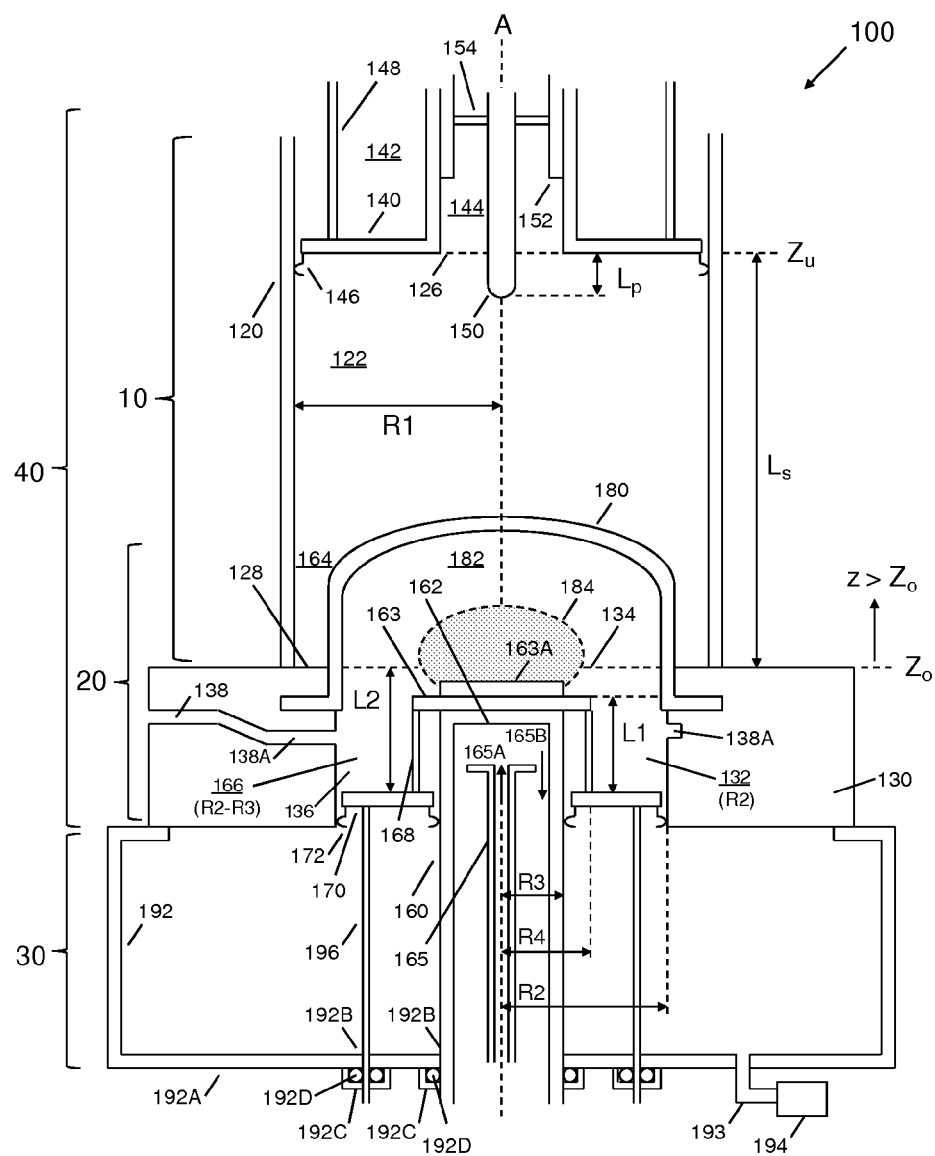
FIGS. 1A and 1B illustrate cross-sectional views of microwave plasma assisted reactor (or microwave cavity plasma reactor; "MCPR") embodiments according to the disclosure.

While the disclosed compositions, apparatus, and methods are susceptible of embodiments in various forms, specific embodiments of the disclosure are illustrated in the drawings (and will hereafter be described) with the understanding that the disclosure is intended to be illustrative, and is not intended to limit the claims to the specific embodiments described and illustrated herein.

DETAILED DESCRIPTION

The present disclosure relates to improved microwave plasma assisted reactors, for example chemical vapor deposition (MPCVD) reactors. The disclosed microwave plasma assisted reactors operate over wide pressure ranges (e.g., ranging from about 10 Torr to about 760 Torr), in particular including elevated pressures (e.g., above about 100 Torr or about 200 Torr). The disclosed reactors include an axially adjustable lower sliding short and/or a reduced diameter conductive stage in a coaxial cavity of a plasma chamber. For a particular application, the lower sliding short position and/or the conductive stage diameter can be variably selected such that, relative to conventional reactors, the reactors can be tuned to operate over larger substrate areas, to operate at higher pressures, and to higher discharge absorbed power densities with increased deposition rates (e.g., carats per hour for diamond synthesis) and increased deposition uniformity.

High Pressure Microwave Discharges

At high pressures and high power densities, microwave discharges in hydrogen gas have neutral gas temperatures in excess of 2500 K, contract and separate from the surrounding discharge chamber walls, and become a very non-uniform, intense and "arc like" discharge. As pressure is increased, the gas temperature and discharge power density increase, resulting in a floating discharge with increased active radical plasma species having the potential for increased growth rates. The formation of contracted and floating microwave discharges at high pressures, which are identified herein as microwave arcs, has been observed and studied in many experiments [17-19, 22]. The microwave arc, like lower frequency arcs, is a thermally inhomogeneous discharge. It has a hot central core, and sharp thermal gradients exist between the discharge center and the surrounding walls. Microwave energy is readily coupled into the electron gas in the hot discharge center because of its reduced gas density, and neutral gas species are also readily ionized, dissociated, and excited in the hot central discharge core. These high pressure microwave discharges have been applied as discharges in electrothermal thruster space engines [22, 25-26] and as high pressure, high power microwave discharge light sources [23].

An important difference between high pressure and low pressure microwave discharges is that the microwave discharge entirely fills the discharge chamber at low pressures and produces a diffusion loss dominated, cold (i.e., gas temperatures are less than 1000 K), non-equilibrium plasma. In the high pressure regime, the microwave discharge is hot (i.e., gas temperatures are greater than 2000 K), is volume recombination dominated, and becomes a more thermal-like discharge. Plasma densities for 2.45 GHz hydrogen discharges operating at 100 Torr to 200 Torr are estimated to be about $10^{11}$ $cm^{-3}$ to about $10^{13}$ $cm^{-3}$ (i.e., free electrons per unit volume) [27, 28]. At these high pressures, the discharge separates from the walls and can become freely floating, taking on shapes that are related to the shape of the impressed electromagnetic fields. The discharge can even move about the discharge chamber as it reacts to the buoyant forces on the discharge and to the convective forces caused by the gas flows in the discharge chamber (e.g., source gas inlet and exhaust gas outlet).

Thus, high pressure microwave discharges behave very differently from the typical low pressure discharge and require new methods of discharge control and microwave applicator and plasma reactor design that take into account the distinctly unique nature of the high pressure microwave plasma. The goal in a CVD application is to control the size, the spatial location and the shape of this very hot, non-uniform discharge in such a manner to enable optimal CVD diamond synthesis. This is a formidable engineering challenge. The disclosed high pressure plasma reactors and associated methods allow the spatial positioning and shaping of this thermally inhomogeneous, hot microwave discharge, thereby enabling the optimization of the diamond CVD process at high pressure.

Reactor Geometry

A cross sectional view of a microwave plasma assisted reactor 100 according to the disclosure is illustrated in FIG. 1A. The reactor 100 generally includes a microwave chamber/section 10, a plasma chamber/section 20, and a vacuum chamber/section 30. The reactor 100 has a generally cylindrical structure with components that are generally aligned along a central axis A (e.g., the z-axis in a cylindrical coordinate system with substantial component symmetry in the θ direction). Collectively, the microwave chamber 10 and the plasma chamber 20 are referenced as an applicator 40. The microwave chamber 10 and the plasma chamber 20 meet at a reference axial location $Z_0$ (or z=0). The applicator 40 includes two coupled cavities at the $Z_0$ plane: a cylindrical cavity section (z>$Z_0$) and a coaxial cavity section (z<$Z_0$).

The microwave chamber 10 includes a cylindrical chamber 120 (e.g., an open-ended metallic cylinder) defining an interior cylindrical cavity 122 of radius R1 aligned with the central axis A. The cylindrical cavity 122 has a lower boundary 128 (e.g., a metallic portion of the base 130) at the reference axial location $Z_0$ and an upper boundary 126 at an axial location $Z_U$>$Z_0$ (i.e., the microwave chamber 10 generally extends upwardly in an axial direction z>$Z_0$). The microwave chamber 10 can be cooled with an external coolant, for example with cooling lines (e.g., for water or other cooling liquid) on the exterior of the cylindrical chamber 120 and/or with a cooling gas inlet/outlet (e.g., for air or other cooling gas) in fluid communication with the cylindrical cavity 122. As illustrated, the cylindrical chamber 120 has a uniform radius R1 throughout its height. In alternative embodiments, the cylindrical chamber 120 can have a multi-section construction, for example including a first cylindrical chamber of radius R1$a$ (or other characteristic width dimension for non-cylindrical chambers) adjacent to the base 130 and a second cylindrical chamber of radius R1$b$ adjacent to the first cylindrical chamber and extending upwardly away from the base 130. In general, R1$a$ can be less than or greater than R1$b$ depending on the resulting influence upon the microwave field in the microwave chamber 10.

The microwave chamber 10 further includes an upper conducting short 140 in electrical contact with the cylindrical chamber 120 and disposed in an upper portion 142 of the cylindrical chamber 120 at an axial distance $L_s$ above $Z_0$. The upper conducting short 140 has a central opening 144, defines the upper boundary 126 of the cylindrical chamber 120, and is electrically connected to the side walls of the cylindrical chamber 120 via finger stocks 146. Preferably, the upper conducting short 140 is slidably disposed in the cylindrical chamber 120, and its axial position can be adjusted by any suitable means, for example using a sliding (e.g., threaded) rod/gear assembly (e.g., via rods 148 (mounted to the upper conducting short 140) and as illustrated in more detail in U.S. Pat. No. 5,311,103; incorporated herein by reference).

The microwave chamber 10 further includes an excitation probe 150 as an electromagnetic wave source extending through the central opening 144 of the upper conducting short 140 and into an upper portion of the cylindrical cavity (or microwave chamber) 122 by an axial distance $L_p$ relative to the upper boundary 126. The excitation probe 150 is generally capable of generating radiofrequency waves in the UHF (e.g., about 300 MHz to about 3 GHz) and/or microwave (e.g., about 300 MHz to about 300 GHz or about 300 MHz to about 100 GHz) frequency domain. Suitable specific excitation frequencies include 915 MHz and 2.45 GHz. As illustrated, the excitation probe 150 is supported in an inner sleeve 152 by an insulator/holder 154. The inner sleeve 152 preferably is adjustably mounted on the interior annular surface of the upper conducting short 140. Similar to the upper conducting short 140, the excitation probe 150 also is adjustably disposed in the cylindrical chamber 120, and its axial position can be adjusted by any suitable means, for example using a gear assembly to slide the inner sleeve 152 and the excitation probe 150 as a unit relative to the upper conducting short 140 (e.g., as illustrated in U.S. Pat. No. 5,311,103; incorporated herein by reference). In an embodiment, the axial positions of both the upper conducting short 140 and the excitation probe 150 are independently adjustable to provide an impedance tuning mechanism to minimize reflected power in the cylindrical cavity 122.

The plasma chamber 20 includes a base 130 (e.g., a metallic base) that defines an interior base cavity 132 (e.g., a cylindrical cavity of radius R2) and that is mounted to the cylindrical chamber 120 of the microwave chamber 10. The interior base cavity 132 has (i) an upper boundary 134 at $Z_0$ and adjacent the cylindrical chamber 120 and (ii) a lower portion 136 extending axially downwardly in a direction z<$Z_0$. As illustrated, the base 130 includes a source/feed gas inlet in fluid connection with the base cavity 132, for example a conduit 138 extending through the base 130 and opening into the base cavity 132 through an annular manifold 138A (or other similar structure for tangentially distributing the source gas). The plasma chamber 20 further includes a quartz bell jar 180 mounted in/on the base 130 and extending upwardly into a bottom portion 164 of the cylindrical cavity 122 (i.e., z>$Z_0$). Together, the base 130 and the quartz bell jar 180 define an interior cavity 182 of the plasma chamber 20 (e.g., by an outer wall/boundary including the quartz bell jar 180 and the interior surface (i.e., at r=R2) of the base 130). The base 130 optionally can include cooling channels (e.g., a water cooling channel and/or a gas cooling channel; not shown) that circulate one or more coolants through the base 130 to provide a mechanism for controlling the temperature of the base 130, the quartz bell jar 180, and/or the interior cavity 182 of the plasma chamber 20 during operation of the reactor 100.

The plasma chamber 20 further includes a coaxial stage 160 (e.g., a conductive stage, for example a metallic tube) having a radius R3 and an upper surface 162. The coaxial stage 160 extends at least into the base cavity 132 and optionally into the bottom portion 164 of the cylindrical cavity 122 (i.e., the axial position of the upper surface 162 can be z<$Z_0$ or z>$Z_0$ based on the axially adjustable nature of the coaxial stage 160). The coaxial stage defines a coaxial cavity (or microwave chamber) 166 between R3 and R2 in the base cavity 132. A substrate holder 163 (e.g., a molybdenum substrate holder) having a radius R4 is mounted on the upper surface 162 of the coaxial stage 160; during operation of the reactor 100, a deposition substrate 163A is placed on the substrate holder 163. The thickness (i.e., in the z-direction) of the substrate holder 163 is suitably about 0.6 cm; however, the thickness can be varied as an additional means to independently vary L1 and L2. As illustrated, the substrate holder 163 is a flat, disk-shaped structure. Alternatively, the substrate holder 163 can contain a recess (not shown) in its upper surface facing the interior cavity 182, and the deposition substrate 163A is seated in the recess during operation. In an embodiment, the coaxial stage 160 includes internal structure to cool (or otherwise control the temperature of) the substrate 163A during operation. As illustrated, a conduit 165 in the interior of the coaxial stage 160 provides an inlet for a (relatively cold) coolant 165A (e.g., gas or liquid, preferably water) that serves as a heat transfer medium to withdraw heat from the substrate 163A and then exits the coaxial stage 160 as a heated coolant 165B. Alternatively, a relatively hot stream 165A can be used to warm the substrate 163 and then exit as a cold stream 165B.

The plasma chamber 20 further includes a lower conducting short 170 adjustably disposed in the coaxial cavity 166 below $Z_0$ and in electrical contact with the base 130 and the coaxial stage 160 via finger stocks 172. As illustrated, the lower conducting short 170 has a solid annular construction (e.g., a metallic construction); however, the lower conducting short 170 can include one or more channels (or other orifices; not shown) that allow effluent gases to escape from the interior cavity 182 of the plasma chamber 20 into the vacuum chamber 30. The axial distance between the lower conducting short 170 and $Z_0$ is L2, and the axial distance between the lower conducting short 170 and the substrate holder 163 (or a base or bottom portion of the substrate 163A) is L1. Alternatively, the distance L1 can be measured between the lower conducting short 170 and an upper or top portion of the substrate 163A. Together, the two distances define a difference $\Delta L = L1 - L2$ that denotes the displacement of the coaxial stage 160, substrate holder 163, and the substrate 163A from $Z_0$.

As illustrated in FIG. 1A, the plasma chamber 20 can further include a quartz tube holder 168. The quartz tube holder 168 is generally mounted on the lower conducting short 170 and extends upwardly to the substrate holder 163. The quartz tube holder 168 has a radius slightly larger than that of the coaxial stage 160, thereby defining an annular gap between the quartz tube holder 168 and the coaxial stage 160. The quartz tube holder 168 controls the flow of exhaust gas leaving the interior cavity 182 of the plasma chamber 20. Specifically, the substrate holder 163 has holes/conduits (not shown) at the outer radial positions of the substrate holder 163, thereby directing exhaust gas from the interior cavity 182 into the annular gap between the quartz tube holder 168 and the coaxial stage 160. In this case, holes/conduits are placed in the lower conducting short 170 at radial positions between the quartz tube holder 168 and the coaxial stage 160. In an embodiment (not shown), the quartz tube holder 168 can be fixed/mounted to the substrate holder 163 and can have portions that slidably extend through accommodating openings in the lower conducting short 170. In this case, L1 and L2 can be slidably adjusted without having to insert a quartz tube holder 168 of variable height.

Figure 1B:
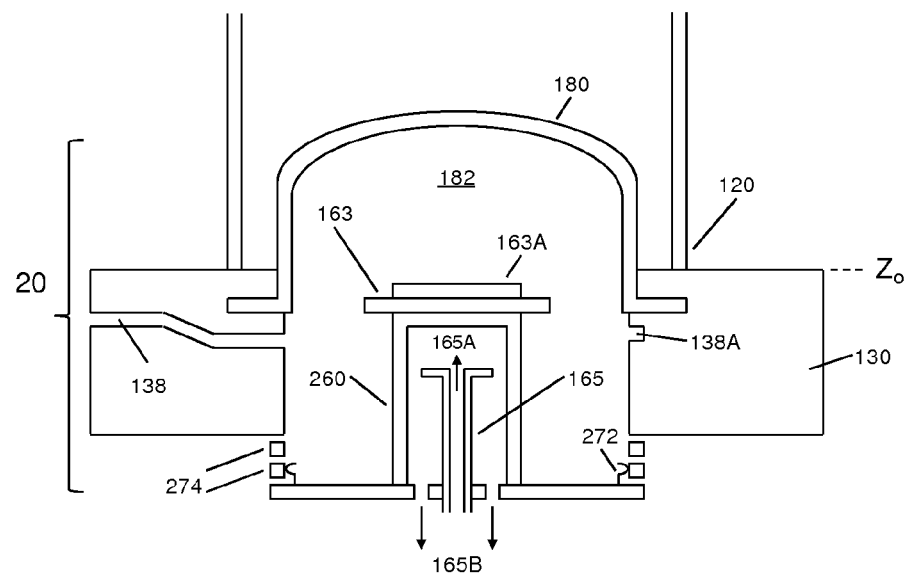

FIG. 1B illustrates an alternate embodiment of the lower conducting short 270. The lower conducting short 270 has a disk-shaped structure (e.g., a metallic construction) that is in electrical contact with the base 130 (via finger stocks 272) and with the conducting stage 260 (via direct contact). The axial position of the lower conducting short 270 is adjustable in the coaxial cavity 166 below $Z_0$ by selecting one or more conducting shim inserts 274 (e.g., conducting annular metallic rings of predetermined height) that are interposed between the base 130 and the lower conducting short 270. The structure illustrated in FIG. 1B is held in place during operation, for example, with bolts (not shown) that extend through lower conducting short 270, the shim inserts 274, and into the base 130. As illustrated, the coaxial stage 260 is a cylinder mounted on the lower conducting short 270; however, the coaxial stage can have similar cooling structure as that illustrated in FIG. 1A (e.g., a coolant inlet and a coolant outlet passing through conduits in the lower conducting short 270 and into the interior of the coaxial stage 260).

An aspect of the disclosed reactors is that the geometric reactor length scales L1 and L2 are adjustable by altering the axial location of the lower conducting short 170/270 in the coaxial cavity 166. In FIG. 1A, the illustrated conducting short 170 is a slidable, annular disk that can be moved in the axial direction before and/or during the operation of the reactor 100. In FIG. 1B, the illustrated conducting short 270 is a disk that can be repositioned in the axial direction by altering the number and/or size of the shim inserts 274 that are axially interposed between the base 130 and the lower conducting short 270. Preferably, both of the length scales L1 and L2 are independently adjustable. Thus, in the embodiment illustrated in FIG. 1A, the coaxial stage 160 is independently slidable/adjustable relative to the conducting short 170 such that L2 can be independently adjusted before and/or during the operation of the reactor 100. In the embodiment illustrated in FIG. 1B, the height of the coaxial stage 160 can be adjusted by selecting stages of differing height for mounting to the conducting short 270. The specific methods for adjusting L1 and L2 are not particularly limited, and can include any of a variety of known methods (e.g., using a gear assembly, using an o-ring sealed movable rod, manually repositioning the components, etc.).

The vacuum chamber 30 is defined by vacuum chamber walls 192 that are mounted to the base 130 of the plasma chamber 20 to provide an air-tight seal. The vacuum chamber 30 further includes a conduit 193 through the chamber walls 192 that is connected to a vacuum pump 194 that helps maintain a desired operating pressure in the plasma chamber 20 during operation. As illustrated, a base portion 192A of the chamber walls 192 can include one or more conduits/openings 192B that permit the structural/mechanical coupling of various elements in the plasma chamber to the external environment. For example, vacuum seals 192C (e.g., including an o-ring 192D) can accommodate slidable rods 196 that are attached to the lower conducting short 170 and that extend through the vacuum chamber 30 to the external environment. The rods 196 can be repositioned to adjust the axial position of the lower conducting short 170 by any of a variety of methods (e.g., manual, coupling to a gear assembly similar to that used to adjust the position of the upper conducting short 140, where the gear assembly can be under manual and/or automatic control). As illustrated, a conduit 192B also is provided for the coaxial stage 160 (and any internal structure such as the conduit 165) so that the coaxial stage 160 can be axially repositioned similarly to the slidable rods 196 and the lower conducting stage 170.

Characteristic dimensions and coordinates of the reactor 100 are shown in FIG. 1A. They are the distance $L_p$ that the excitation probe 150 extends beyond the conducting short 140, the height $L_s$ of the cylindrical cavity 122, the radius R1 of the cylindrical cavity, the radii R2 and R3 that define the annular width of the coaxial cavity 166, the radius R4 of the substrate holder 163, the thickness D of the substrate holder 163, and lengths L1 and L2 in the coaxial cavity 166 defining the position of the lower conducting short 170 and the coaxial stage 160. Generally, $R1 \geq R2 \geq R4 \geq R3$ and $L_s \geq L1$ and L2, although other variations are possible. The substrate 163A itself is located approximately at $Z_0$ near the open end of the coaxial cavity 160 on the substrate holder 163. Thus, the upper surface 162 of the conducting coaxial stage 160 serves as a platform for the substrate holder 163, and the interior of the coaxial stage 160 allows temperature control of the substrate 163A (e.g., via water cooling/heating as illustrated). The conducting coaxial stage 160 and the substrate holder 163 are collectively identified as the powered electrode. The difference between L1 and L2 (i.e., $L1 - L2 \equiv \Delta L$), is the distance that the top surface of the powered electrode or the substrate surface is above or below the cylindrical cavity 122 bottom $Z_0$ plane (z=0).

The specific dimensions of a given reactor design generally scale inversely with the microwave excitation frequency of the excitation probe 150 (i.e., relatively higher probe 150 frequencies generally call for smaller reactor scales and vice versa). Two common excitation frequencies are 2.45 GHz and 915 MHz. For a 2.45 GHz-reactor, suitable dimensions include R1 ranging from about 6 cm to about 12 cm or 18 cm (e.g., about 8.9 cm), R2 ranging from about 5 cm to about 10 cm or 15 cm (e.g., about 7.0 cm), R3 ranging from about 0.5 cm to about 5 cm or 8 cm (e.g., about 0.95 cm, 1.9 cm, or 4.1 cm)), R4 ranging from about 1 cm to about 6 cm or 12 cm (e.g., about 3.25 cm), $L_s$ ranging from about 15 cm to about 25 cm (e.g., about 20 cm), $L_p$ ranging from about 2 cm to about 5 cm (e.g., about 3.6 cm), and/or L1 and L2 independently ranging from about 4 cm to about 8 cm (e.g., |ΔL| about 2 cm, 1 cm, or 0.5 cm or less, including cases where ΔL≠0 (i.e., a net displacement of the substrate 163/coaxial stage 160 from $Z_0$)). For a 915 MHz-reactor, suitable dimensions include R1 ranging from about 15 cm to about 25 cm or 40 cm (e.g., about 30 cm), R2 ranging from about 5 cm to about 30 cm (e.g., about 15 cm), R3 ranging from about 2 cm to about 20 cm (e.g., about 9.5 cm), R4 ranging from about 2 cm to about 20 cm (e.g., about 12 cm), $L_s$ ranging from about 40 cm to about 80 cm (e.g., about 60 cm), $L_p$ ranging from about 5 cm to about 15 cm (e.g., about 8 cm), and/or L1 and L2 independently ranging from about 10 cm to about 20 cm (e.g., |ΔL| about 5 cm, 2 cm, or 1 cm or less, including cases where ΔL≠0 (i.e., a net displacement of the substrate 163/coaxial stage 160 from $Z_0$)).

The ratio R3/R2 can be up to about 0.8 in many applications. An aspect of the disclosure, however, is that a reduction in the size/diameter of the coaxial stage 160 allows an increase in the applied power density of the plasma in a manner that is controllable to permit uniform and high deposition rates (e.g., of diamond) on the substrate 163A. Thus, the radius R3 is suitably small relative to R2. For example, the ratio R3/R2 is suitably about 0.5 or less, about 0.4 or less, about 0.3 or less, or about 0.2 or less. Due to practical structural considerations (e.g., if the coaxial stage 160 include internal temperature control structure), the ratio R3/R2 is suitably about 0.05 or more, or about 0.1 or more.

Another aspect of the disclosure is that relatively fine adjustments of the axial positions of the lower conducting short 170 and/or the coaxial stage 160 (e.g., in the neighborhood of $Z_0$) allow positioning of the electromagnetic focus of the plasma above the substrate 163A to provide an additional means to control deposition rates. Thus, during or before operation (e.g., when tuning the reactor and/or when depositing a component), the distance ΔL is suitably small relative to L1 and/or L2. For example, the ratio |ΔL|/L1 or |ΔL|/L2 is suitably about 0.5 or less, about 0.2 or less, about 0.1 or less, or about 0.05 or less. In practice, a desirable, tuned value of ΔL is non-zero, and often ΔL<0 during operation.

The disclosed reactor can be provided in the form of a kit that facilitates the selection by a user of specific geometric embodiments. For example, the kit can include a microwave plasma assisted reactor according to any of the disclosed embodiments in conjunction with at least one of: (a) a plurality of cylindrical chambers, each defining an interior cylindrical cavity of a different radius R1; (b) a plurality of bases, each defining an interior base cavity of a different radius R2; and, (c) a plurality of coaxial stages, each having a different radius R3. When the kit includes a plurality of bases, a plurality of appropriately sized quartz bell jars and lower conducting shorts (whether disk-shaped, annular, or otherwise) are also included in the kit. Similarly, when the kit includes a plurality of coaxial stages, a plurality of appropriately sized lower conducting shorts also can be included in the kit (e.g., annular lower conducting shorts should be complementary in size with the individual coaxial stages; however, a single disk-shaped lower conducting short can accommodate the plurality of coaxial stages). A plurality of shim inserts (with the same or different heights) also can be provided in the kit. Thus, the reactor can be assembled with any combination of the cylindrical chambers, the bases, the coaxial stages, and any attendant complementary parts such that at least one of R1, R2, and R3 can be varied in a selected reactor assembly.

Reactor Operation

Figure 2:
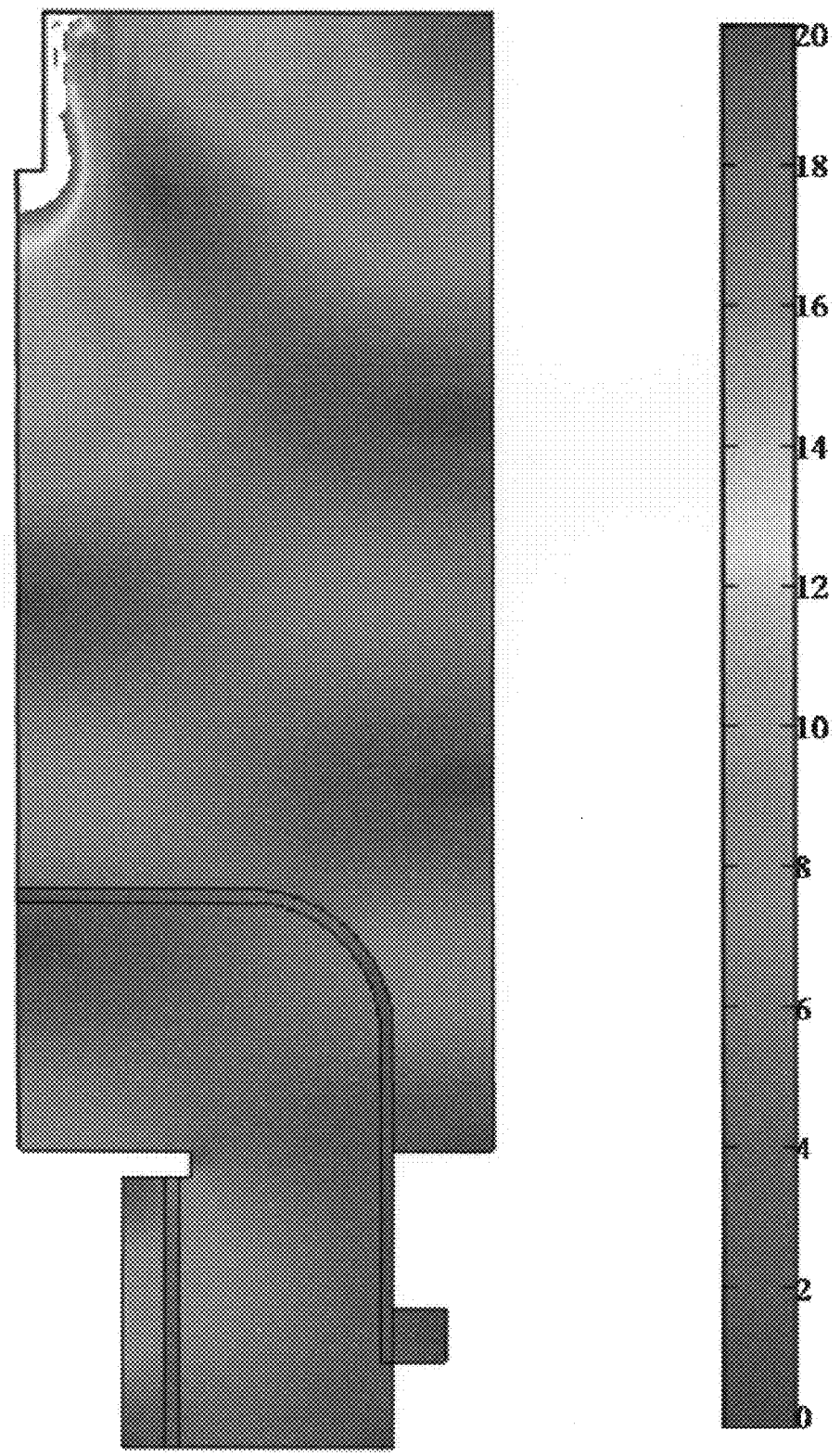
FIG. 2 illustrates electric field distribution patterns inside a MPCR using a COMSOL MULTIPHYSICS 2D axial symmetry model, where color intensities indicate the electric field strength in V/m (excited frequency=2.45 GHz, R1=8.89 cm, R2=7.04 cm, R3=1.91 cm, R4=3.24 cm, substrate holder thickness=0.58 cm, bell jar height=8 cm, Ls=21.6 cm, L1=5.65 cm, L2=5.08 cm).
Figure 3:
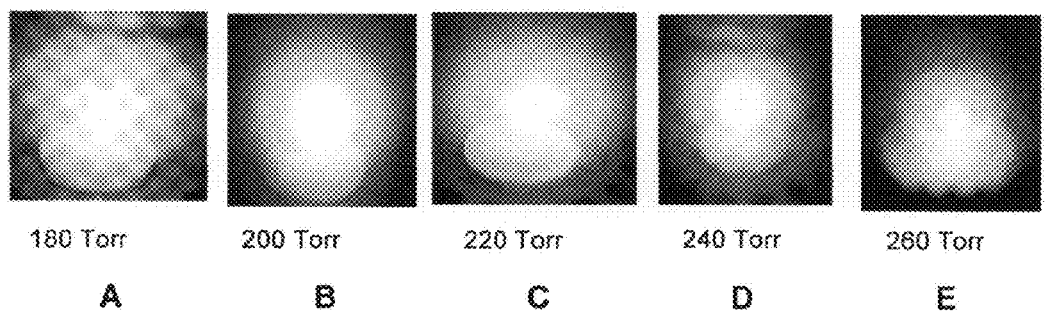
FIG. 3 presents images of plasma discharge and deposition substrate at operating pressures 180 Torr (a), 200 Torr (b), 220 Torr (c), 240 Torr (d), and 260 Torr (e).

In practice, the plasma loaded applicator is excited with the hybrid $TM_{013}+TEM_{001}$ electromagnetic mode. In order to achieve $TM_{013}$ excitation in the open cylindrical cavity 122, $L_s$ is preferably adjusted/selected to be very close to $3\lambda_g/2$, where $\lambda_g$ is the guided wavelength of the $TM_{01}$ cylindrical waveguide mode. In order to achieve $TEM_{001}$ excitation in the coaxial section, L2 is preferably adjusted/selected to approximately $\lambda_0/2$, where $\lambda_0$ is the free space wavelength. In general, $\lambda_0$ is based on the relationship $f\lambda_0=c$ (e.g., for excitation frequency f=2.45 GHz, $\lambda_0$=12.2 cm; for f=915 MHz, $\lambda_0$=32.8 cm). In practice, $\lambda_g$ is larger than $\lambda_0$ and can be computed as $\lambda_g=\lambda_0(1-(f_c/f)^2)^{-1/2}$, where $f_c$ is the cut-off frequency (and $f>f_c$). Suitable discharge ignition starting lengths for process development are when L1 and L2 are equal to each other and are equal to approximately $\lambda_0/2$. Then, ΔL is zero and the top of the substrate is substantially even with the $Z_0$ plane. Suitable starting lengths for the cylindrical section are $L_s$ of about $3\lambda_g/2$ and the coupling probe depth $L_p$ of about $\lambda_g/4$. Representative reactor electromagnetic field intensity patterns for this starting condition are displayed in FIG. 2.

The geometry of the reactor 100 is generally a function of the geometric variables $L_s$, $L_p$, L1, L2, R1, R2, R3, and R4. When these geometric length variables are changed, the electromagnetic fields and the electromagnetic focus in the local region above and around the $Z_0$ plane are controlled and altered. Similarly, when a microwave discharge or plasma is present, the discharge power density, the plasma shape, and the plasma position can be altered by varying one or more of the geometric variables. Thus, a microwave plasma assisted deposition process (e.g., diamond synthesis) also can be changed, controlled, and optimized by changes in the reactor geometry.

When the size and shape of the reactor 100 is varied, for example by changing the various reactor radii or lengths, the reactor can be optimized for a specific deposition process. In practice R1 is determined primarily by the choice of the excitation frequency Generally, a range of R1 values can be used, ranging from a minimum R1 for the $TM_{013}$ mode to exist and some maximum R1 at which a distinct $TM_{013}$ mode is difficult to obtain due to many other modes having a similar $L_s$ value, and R2 and R3 are then determined by the specific process application (e.g., desired substrate size, operating pressure regime). For example, for low pressure, large-area operation and low discharge power density, R2 and R3 take on lengths that are slightly smaller than R1. Reactor designs according the disclosure often fix the applicator radii, and then, during process optimization, the electromagnetic field patterns and associated microwave discharge are modified by varying L1, L2, $L_s$ and $L_p$ as well as pressure and input microwave power. This is a multivariable optimization procedure that is initially performed by the operator during process development and after some experience it can also be performed automatically via a preprogrammed recipe. Since there are many variables, there are many possible shapes, positions, and intensities that the discharge can assume in the vicinity of the $Z_0$ plane, and all of these are available for process optimization.

The reactor 100 in any of its embodiments can be operated in a process to deposit a component (e.g., single-crystal diamond, polycrystalline diamond) on the substrate 163A mounted or otherwise located above the coaxial stage 160 (e.g., on the substrate holder 163). The specific construction of the substrate 163A is not particularly limited and can be suitably selected based on the particular component being deposited. For example, single-crystal diamond can be deposited on a single-crystal seed substrate (e.g., high-pressure, high-temperature single-crystal seed), and polycrystalline diamond can be deposited on a silicon-based substrate (e.g., nucleation-seeded silicon, doped silicon, or silicon nitride). Polycrystalline diamond can include both nanocrystalline diamond (e.g., crystals on the order of nanometers to hundreds of nanometers) and microcrystalline diamond (e.g., crystals on the order of micrometers to hundreds of micrometers).

The reactor 100 is operated by applying power to the excitation probe 150 to generate electromagnetic waves at a selected frequency. For example, applied powers ranging from about 1 kW to about 10 kW (e.g., about 2 kW to about 3 kW or about 4 kW) are suitable for a 2.45 GHz frequency, and applied powers ranging from about 5 kW to about 30 kW are suitable for a 915 MHz frequency. Based on the reactor 100 geometry and depending on the particular selection of characteristic length scales, a first electromagnetic mode $M_1$ (e.g., $TM_{013}$) can be excited in the cylindrical chamber 122 of the reactor 100 and a second electromagnetic mode $M_2$ (e.g., $TEM_{001}$) can be excited in the coaxial chamber 166 of the reactor 100, thereby forming a hybrid electromagnetic mode $M_3$ in the plasma chamber 20. This "hybrid mode" has field patterns that are predominantly $TM_{013}$ in the cylindrical chamber and $TEM_{001}$ in the coaxial chamber. The two electromagnetic field patterns interact at the discontinuous $z=Z_0$ boundary plane. The abrupt physical discontinuity at the $Z_0$ plane sets up local evanescent fields on either side of the plane and the total field in the vicinity of the deposition substrate 163A (i.e., the impressed electromagnetic field that creates and sustains the plasma) is the sum of the two modes $M_1$ and $M_2$ plus the induced evanescent field.

The impressed substrate field can be varied by spatially changing the evanescent field around the discontinuity plane by varying the various dimensions such as R1, R2, R3 L1, and L2, etc. Thus by changing these dimensions, the electromagnetic focus at the substrate is varied. For example if R3 is reduced and L1 and L2 are approximately equal to one half of the free space wave length, then the field at the end of the substrate holder will be intense and mainly perpendicular to the top of the substrate. If L1 and L2 are then varied slightly, the field then has additional inward or outward directed radial components, there by changing the total impressed field pattern. If R3 and R4 are large (i.e., with respect to R2) then the impressed field pattern is reduced, but is more uniform over a larger radius, there by producing a more uniform plasma and a more uniform deposition over the larger substrate area. Thus, it is clear that a large variety of impressed electromagnetic field patterns can be created in the vicinity of the substrate by adjusting the reactor dimensions. Given a specific microwave plasma assisted CVD application, the reactor dimensions and tuning can be adjusted to optimize a specific process.

A source gas is fed to the interior cavity 182 of the plasma chamber 20 at a selected operating pressure to form a plasma 184 when power is being applied. The particular operating pressure in the plasma chamber 20 can range between about 10 Torr and 760 Torr and can be suitably controlled by the vacuum pump 194 and/or by source gas flow rates. The operating pressure is desirably increased, however, to increase the deposition rate of the component on the substrate 163A. For example, operating pressures of at least about 100 Torr, 150 Torr, 180 Torr, 200 Torr, or 220 Torr and/or up to about 300 Torr, 500 Torr, or 760 Torr can be selected in various embodiments. More particularly, suitable pressures at a 915 MHz frequency can range from about 100 Torr to about 160 Torr (e.g., when the substrate 163A ranges from about 10 cm to about 14 cm in size/diameter) or from about 20 Torr to about 100 Torr (e.g., when the substrate 163A ranges from about 14 cm to about 20 cm in size/diameter). Suitable pressures at a 2.45 GHz frequency can range from about 50 Torr to about 150 Torr (e.g., when the substrate 163A ranges from about 6 cm to about 9 cm in size/diameter). Alternatively, pressures at a 2.45 GHz frequency can range from about 100 Torr to about 400 Torr, about 180 Torr to about 260 Torr, or about 220 Torr to about 260 Torr (e.g., when the substrate 163A is up to about 6 cm or up to about 3 cm in size/diameter).

The particular source gas(es) fed to the plasma chamber 20 will depend on the particular deposition component. For diamond deposition, a mixture of methane ($CH_4$) and hydrogen ($H_2$) is suitable. The feed composition is generally expressed as a mol. % (or vol. %) of methane relative to hydrogen. For example, feed compositions of at least about 1 mol. % $CH_4$, 2 mol. % $CH_4$, or 3 mol. % $CH_4$ and/or up to about 5 mol. % $CH_4$, 6 mol. % $CH_4$, 8 mol. % $CH_4$, or 10 mol. % $CH_4$ can be selected in various embodiments. In some embodiments, the source gas can further include nitrogen ($N_2$) to increase the diamond deposition rate. Suitable nitrogen feed concentrations can range from about 0.005 mol. % $N_2$ to about 2 mol. % $N_2$ relative to the hydrogen feed. Other source gases may be incorporated as desired to add desired dopants, for example including diborane ($B_2H_6$; to form boron-doped diamond). In yet other embodiments, an inert carrier gas (e.g., argon) can form the bulk of the source gas with desired levels of methane, hydrogen, etc. added to the carrier gas.

The process further includes adjusting the axial position of the lower conducting short 170 and/or the coaxial stage 160 of the reactor 100 to selectively position the electromagnetic focus of the plasma 184 above the substrate 163A during operation. The axial position adjustments can be made prior to operation of the reactor 100. For example, the lower conducting short 170 and the coaxial stage 160 can be set to their desired axial positions after which the reactor 100 can be powered on to execute a brief ignition step and then to perform a continuous deposition process according to the foregoing parameters. Alternatively or additionally, the lower conducting short 170 and the coaxial stage 160 can be set to their desired axial positions during the operation of the reactor 100 (e.g., using the structure illustrated in FIG. 1A to adjust the lower conducting short 170 and the coaxial stage 160 without needing to disassemble or otherwise access the plasma chamber 20 and the vacuum chamber 30).

The axial position adjustments can form the basis for a more general reactor tuning process. Specifically, a plurality (e.g., two or more) of combinations of L1 and L2 can be selected to identify favorable/optimum deposition properties (e.g., power density, substrate temperature, deposition rate, deposition uniformity) at a selected set of other operating parameters (e.g., operating pressure, source gas composition, applied power, coaxial stage radius (or other geometric parameters)). For example: L1 is held constant and L2 is parametrically varied over a plurality of values, L2 is held constant and L1 is parametrically varied over a plurality of values, or L1 and L2 are both parametrically varied over a plurality of values. Such parametric variation can be expressed in terms of a plurality of ΔL values that are individually tested (e.g., a plurality of ΔL/L1 or ΔL/L2 values ranging from about −0.5 to about 0.5, about −0.2 to about 0.2, about −0.1 to about 0.1, or about −0.05 to about 0.05). The tuning process is completed by operating the reactor 100 at each of the plurality of L1 and L2 (or ΔL) combinations and then measuring or otherwise characterizing one or more deposition properties resulting from each individual tuning selection. Deposition properties can be measured at each combination of L1 and L2 (e.g., as illustrated in FIGS. 6, 7, 8, and 11), and a specific set of L1 and L2 values (or the "tuned" L1 and L2 values) can be selected as that which maximizes or otherwise optimizes the reactor operation in terms of one or more deposition properties. For example, it is generally desirable to maximize the power density and/or the deposition rate, and such maximization can be constrained by a desire to simultaneously maintain the substrate temperature and/or the deposition uniformity within or under a specific range based on safety and/or quality considerations.

Figure 6:
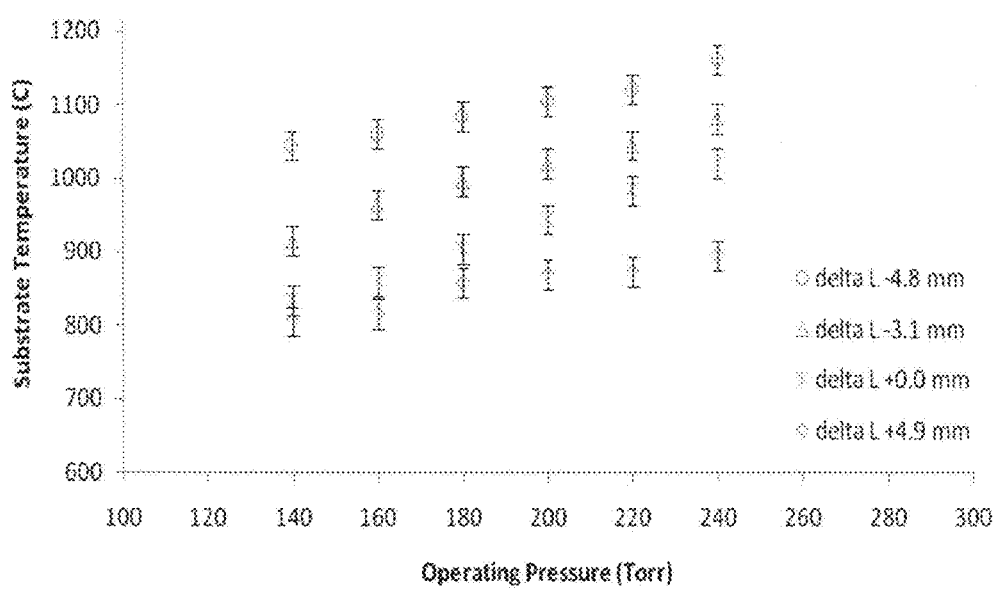
FIG. 6 illustrates substrate temperature as a function of substrate positions (ΔL) and operating pressures; vertical bars represent the maximum/minimum variation of the substrate temperature.
Figure 7:
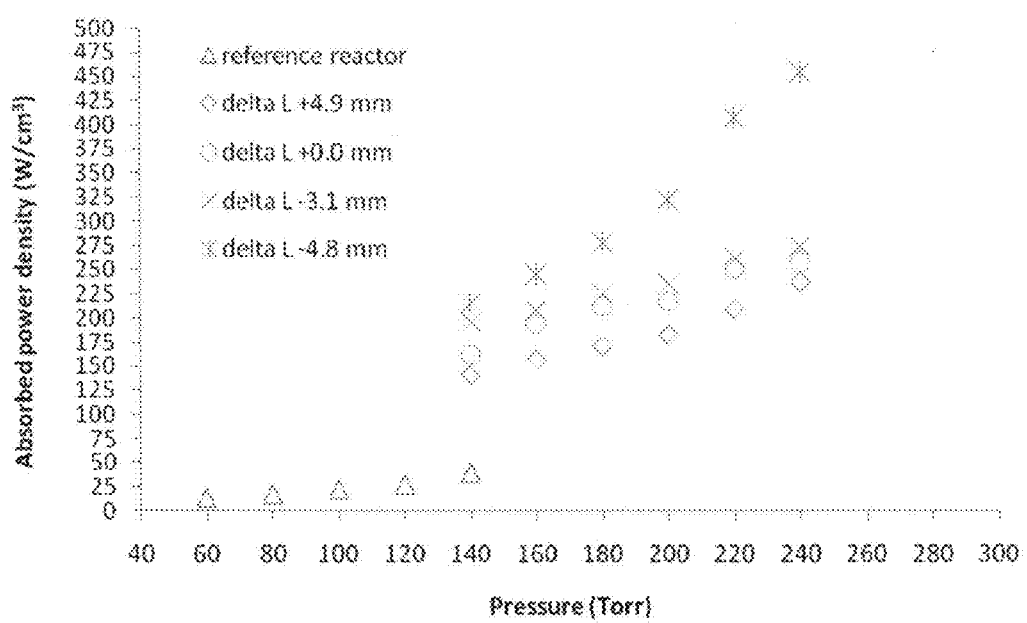
FIG. 7 illustrates absorbed plasma power density as a function of operating pressure for both the reference reactor (R3=4.13 cm and R4=5.08 cm) and the modified reactor (R3=1.91 cm and R4=3.24 cm) at various substrate positions (ΔL).
Figure 9:
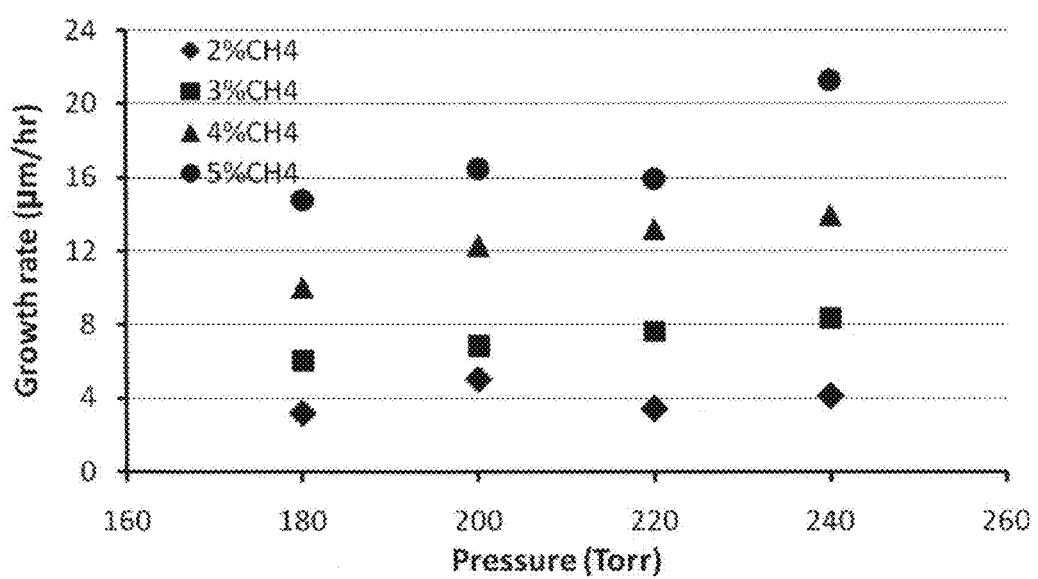
FIG. 9 illustrates polycrystalline diamond growth rate as a function of operating pressure and source gas chemistry (2 mol. % to 5 mol. % $CH_4$ in $H_2$ with no addition of nitrogen gas).

While the tuning process generally applies to the selection of favorable/optimum geometric parameters for reactor operation, other operating conditions can be parametrically varied over a plurality of values in addition to the plurality of L1 and L2 values as part of the tuning process. For example, the operating pressure and/or the source gas composition can be varied to characterize their influence on one or more deposition properties (e.g., as illustrated in FIGS. 6, 7, and 9).

The particular selection of geometric reactor parameters (e.g., coaxial stage 160 radius R3, coaxial stage 160 distance L1, lower conducting short 170 distance L2) permits operation of the reactor 100 under conditions that result in favorable/optimum properties of deposition process and/or resulting deposition film. Particular deposition properties of interest include applied power density, substrate temperature, deposition rate, and deposition uniformity. Thus, the reactor 100 is preferably capable of obtaining any combination of the foregoing deposition properties during operation, for example including deposition property values within the following ranges.

The power density (or discharge power density) is the absorbed microwave power divided by the plasma 184 volume. A relatively high power density is desirable as it generally leads to higher component deposition rates. In various embodiments, the power density is suitably at least about 50 W/cm$^3$, 100 W/cm$^3$, 120 W/cm$^3$, or 160 W/cm$^3$ and/or up to about 500 W/Cm$^3$, 600 W/cm$^3$, 800 W/cm$^3$, 1000 W/cm$^3$, or 2000 W/cm$^3$.

During deposition, the temperature uniformity across the substrate 163A correlates with the size of the plasma 184. At low microwave powers, the plasma 184 may not completely cover the substrate 163A, leading to incomplete and/or non-uniform deposition. At higher microwave powers, the plasma 184 may expand in size to the point that it begins excessively heating the quartz bell jar 180. Thus, the substrate temperature uniformity and quartz bell jar temperature are preferably monitored and controlled during operation of the reactor 100 to achieve desired substrate temperature and substrate temperature uniformity without overheating the quartz bell jar (e.g., via the coolant 165A internal to the coaxial stage 160 and/or by adjusting the applied input power and/or operating pressure). For example, in a 2.45-GHz reactor and at elevated operating pressures of interest, the substrate temperature suitably ranges from about 1000° C. to about 1200° C., about 1050° C. to about 1200° C., or about 1100° C. to about 1200° C.

The deposition rate is suitably expressed as an integral property of the deposition process (i.e., total deposited (average) film thickness divided by the total deposition time, for example in microns per hour) and is desirably maximized to increase process throughput. In various embodiments, the deposition rate is suitably at least about 2 μm/h, 3 μm/h, 6 μm/h, 10 μm/h, 12 μm/h, or 15 μm/h and/or up to about 20 μm/h, 25 μm/h, 30 μm/h, 40 μm/h, 50 μm/h, 75 μm/h, 100 μm/h, or 150 μm/h (e.g., with the optional introduction of a nitrogen source gas) in particular for single crystal diamond and (microcrystalline) polycrystalline diamond. Deposition rates for nanocrystalline diamond are often lower, for example being at least about 50 nm/h or 100 nm/h and/or up to about 200 nm/h or 500 nm/h.

The deposition non-uniformity is desirably small so that the physical properties of the resulting film will be relatively homogeneous, regardless of how the resulting film is used in a practical setting. The deposition uniformity can be expressed as the percent relative deviation of the deposited component's film thickness measured at multiple (e.g., three or more) spatial locations (e.g., circumferential and/or radial locations) in the film. As reported herein, the deposition uniformity is the percent difference between the maximum and minimum measured thicknesses normalized to the average film thickness. In various embodiments, the deposition uniformity is suitably up to about 15%, 10%, 5%, or 3%. While the deposition uniformity is desirably as small as possible, process variability can result in deposition uniformities of at least about 0.1%, 0.2%, 0.5%, or 1%.

EXAMPLES

The following examples illustrate several geometric designs and the performance of the high pressure/high power density reactor of FIG. 1B (and Example 1) with respect to polycrystalline and single crystal diamond deposition. In the following examples, a 2.45 GHz microwave plasma assisted CVD reactor along with its attendant power supply, source/effluent gas flow controllers, coolant flow controllers, etc. was structurally modified to incorporate one or more shim inserts such that L1 and L2 were independently adjustable (i.e., variably positionable lower conducting short and coaxial stage).

Example 1

High Pressure/High Power Density Reactor Design

FIG. 1B illustrates the structure of a reactor designed according to the present disclosure that allows operation at higher discharge power densities and higher pressures. The substrate holder radius R4=3.24 cm and the coaxial cavity inner conductor radius R3=1.91 cm. Thus, the cross-sectional area of coaxial cavity center conductor is reduced by a factor of about 4.5 (i.e., the square of the ratio of R3 values is 4.68) relative to the reference reactor (Example 2 below). This modification focuses the electromagnetic energy on the reduced diameter substrate holder and increases the axial electric field intensity and the associated displacement current density at the location of the substrate surface. This redesign not only increases the plasma absorbed power density above the substrate, but also facilitates operation at higher pressures. The electromagnetic field focus at and above the substrate is additionally controlled and varied during process development by length-tuning the geometric variables L1, L2, $L_s$ and $L_p$. When a plasma discharge is present, this length tuning changes the electromagnetic field focus and in turn, changes the location and the shape of the plasma.

In the following examples, $L_s$ and $L_p$ are adjusted to excite and match the $TM_{013}$ mode in the cylindrical section of the applicator. Thus, $L_s$=20.3 cm and $L_p$=3.6 cm. During process optimization/tuning, L1 is held constant at 5.65 cm, while L2 is varied between 5.16 cm and 6.13 cm. Thus, ΔL (i.e., L1–L2) is varied between +0.49 cm and –0.48 cm, resulting in an experimental variation of about +/–0.5 cm around the $Z_0$ (or z=0) plane. As the substrate axial position is varied, the electromagnetic field intensity and spatial distribution also are altered in the local region of the discharge (i.e., around the $Z_0$ plane).

Example 2

Reference Reactor Design

Several publications [6-7, 2021] report the use of a 2.45 GHz-MPCR for CVD diamond synthesis over low to moderate operating pressures of 60 Torr to 160 Torr. The specific dimensions of this reference reactor are R1=8.89 cm, R2=7.04 cm, R3=4.13 cm, and R4=5.08 cm. The dimensions were chosen to enable diamond synthesis over larger substrate areas (i.e., about 5 cm to about 10 cm diameter) while operating in the low to moderate pressure regime (i.e., about 20 Torr to about 160 Torr). The performance of the reference reactor is compared with that of the high pressure/high power density reactor design according to the present disclosure.

Examples 3 to 5

Alternate High Pressure/High Power Density Reactor Designs

The higher pressure/high power density reactor design of Example 1 can be further modified for different target applications. For instance, the coaxial cavity inner conductor radius can be further reduced to R3=0.95 cm in a 2.45 GHz reactor (Example 3; where L1 and L2 represent approximate initial values prior to tuning). The reduced value for R3 further focuses the electromagnetic energy in the neighborhood of the substrate and substrate holder, thus further increasing the applied power density. In another embodiment, the reactor geometry can be scaled up for a 915 MHz microwave excitation frequency, for example to accommodate substrates up to about 10 cm to about 12 cm in diameter at operating pressures ranging from about 110 Torr to about 160 Torr (Example 4). In another embodiment, the reactor geometry can be scaled up to optimize the plasma performance for nanocrystalline diamond deposition at a 2.45 GHz microwave excitation frequency (e.g., about 300 nm/h at 160 Torr), for example to accommodate substrates up to about 10 cm in diameter at operating pressures ranging from about 40 Torr or 70 Torr to about 100 Torr to about 200 Torr (Example 5). In Example 5, the reactor's cylindrical chamber has a dual-radius design, with (a) a lower portion of the chamber having a radius of about 12.2 cm and a height essentially the same as the extent to which the quartz bell jar extends into the microwave chamber and (b) an upper portion of the chamber having a radius of about 15.6 cm and extending the remainder of the way to the top of the chamber (e.g., at least up to the location of the upper conducting short).

The various geometric parameters of Examples 1-4 are summarized in Table 1.

Example 6

Polycrystalline Diamond Deposition

The reactor of Example 1 was tested for its ability to deposit (microcrystalline) polycrystalline diamond at high operating pressures and high power densities.

Start up and experimental procedures: Before plasma ignition, the applicator is length-adjusted to excite the hybrid electromagnetic resonance. Discharge ignition is achieved at pressures of about 1 Torr to about 20 Torr. Once the discharge is ignited, $L_s$ and $L_p$ are readjusted to match the microwave power into the applicator and hence into the discharge, and pressure is also increased to the desired operating pressure. The substrate is a 25.4 mm-diameter and 1.5 mm-thick silicon wafer. The silicon wafer is nucleation seeded by mechanical polishing using natural diamond power of size$\leq$0.25 μm, cleaned using acetone and deionized water, and then placed on the molybdenum substrate holder. The linear diamond growth rates are determined by measuring the weight of the substrate before and after deposition (i.e., total weight gain) divided by the deposited substrate area and mass density of diamond 3.515 g/cm$^3$. Calibrated incident and reflected power meters are located in the input microwave circuit, and the input absorbed microwave power is determined from the difference between the experimentally measured incident and reflected power.

The experimental pressure variation ranged between 60 Torr and 240 Torr, and microwave input powers varied between 1.5 kW and 2.8 kW. The reflected power was less than 5% of the incident power, which indicated a good impedance match into the MCPR. Hydrogen and methane were the synthesis gases, and the percentage of methane was varied from 2% to 5% (i.e., mol. % $CH_4$ relative to $H_2$). The hydrogen flow rate was fixed at 400 sccm and methane flow varied from 8 sccm to 20 sccm. The $H_2$ and $CH_4$ source gases source had a purity level of 99.9995% and 99.99% respectively, and no additional $N_2$ was added into the gas system. A one-color pyrometer (emissivity set to 0.6) was used to monitor the substrate temperature during the diamond deposition through a viewing port window on the cavity applicator.

During ignition at about 5 Torr, the plasma discharge initially filled the whole discharge chamber, and a similar effect was observed on the reference reactor (Example 2). As the pressure was gradually increased, however, the plasma size began to shrink at about 60 Torr and gradually became smaller as the pressure reached 240 Torr. FIGS. 3A-3E display photographs of the plasma discharge hovering over the silicon substrate as the operating pressure increases from 180 Torr to 260 Torr. At high pressure, the discharge has a green color and

TABLE 1

Reactor Scales

| Property | Example 1 | Example 2 | Example 3 | Example 4 | Example 5 |
|---|---|---|---|---|---|
| Frequency | 2.45 GHz | 2.45 GHz | 2.45 GHz | 915 MHz | 2.45 GHz |
| R1 | 8.89 cm | 8.89 cm | 8.89 cm | 30.0 cm | 15.6 cm |
| R2 | 7.04 cm | 7.04 cm | 7.04 cm | 15.0 cm | 11.5 cm |
| R3 | 1.91 cm | 4.13 cm | 0.95 cm | 9.5 cm | 6.78 cm |
| R4 | 3.24 cm | 5.08 cm | ~1.25 cm-~1.5 cm | 12.0 cm | 10.0 cm/12.2 cm |
| L1 | 5.65 cm | ~5.63 cm-~6.63 cm | 5.65 cm | ~15.4 cm-~17.4 cm | 6.22 cm |
| L2 | 5.16 cm-6.13 cm | ~6.13 cm | 5.65 cm | ~16.4 cm | 5.71 cm |
| $L_s$ | 20.3 cm | 20.3 cm | 20.3 cm | 60 cm | ~16 cm-~17 cm |
| $L_p$ | 3.6 cm | 3.6 cm | 3.6 cm | ~8.2 cm | ~3.2 cm | has an intense almost white center core. As illustrated, the discharge becomes more visually intense, and shrinks in size as the pressure increases.

Figure 4A:
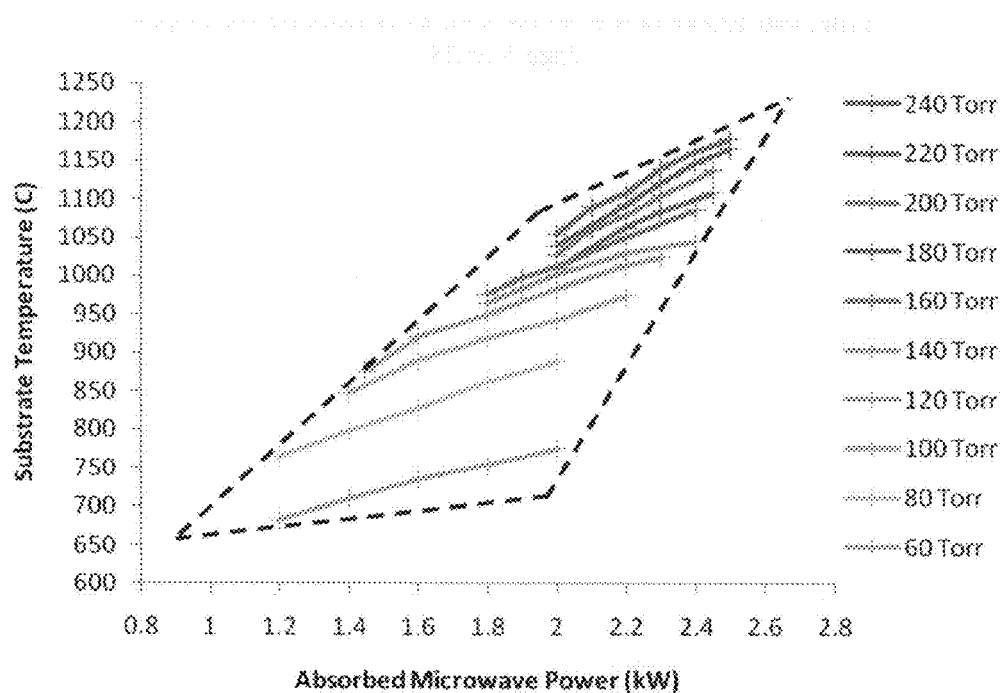
FIGS. 4A and 4B illustrate substrate temperature as a function of absorbed microwave power at operating pressures of 60 Torr-240 Torr (4A) and 180 Torr-240 Torr (4B).
Figure 4B:
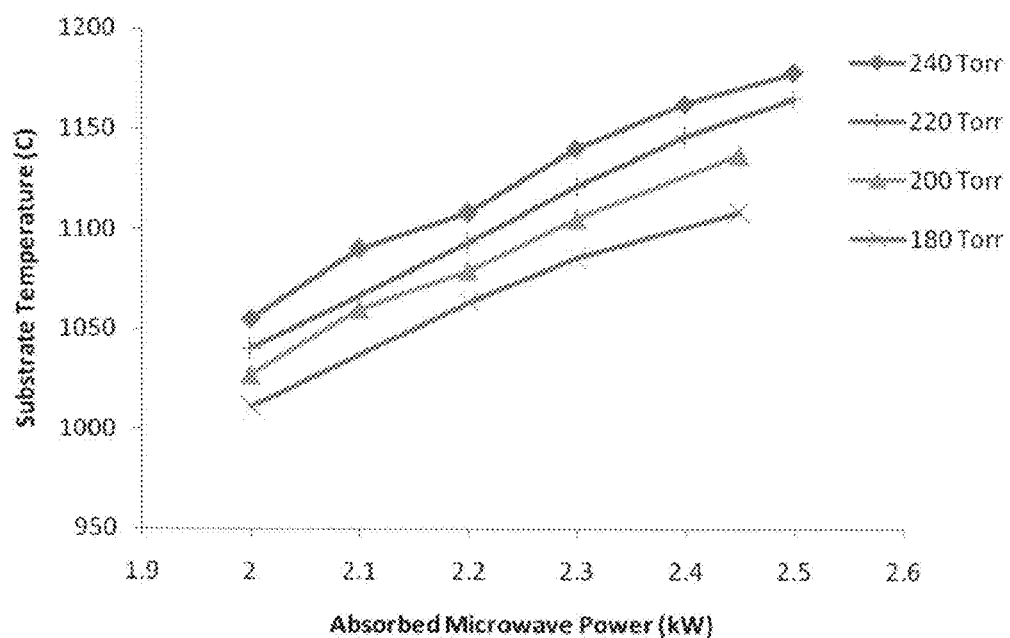

Reactor operation: When the reactor geometry, substrate size, and total gas flow rate are held fixed, the deposition process is a function of input power, pressure, substrate temperature, and methane concentration. The major variables are the input power, pressure and substrate temperature. The relationship between these variables is nonlinear, and the relationship between them can best be understood by experimentally measuring and plotting a set of these curves [20, 21, and 24] to illustrate the substrate temperature as a function of input power and operating pressure. FIGS. 4A and 4B are operating curves for the Example 1 reactor where the reactor geometry is held fixed at $L_s$=20.5 cm, $L_p$=3.5 cm, L2=6.13 cm, and $\Delta L$=−0.48 cm, the total gas flow rate is 412 sccm, and methane percentage is 3%.

Each of the experimental curves in FIG. 4A is plotted for a constant pressure and the set of curves displays the variation of the substrate temperature versus input microwave power over the entire 60 Torr to 240 Torr pressure regime. Only the safe and process useful operating data points are displayed in FIG. 4A. The allowable operating regime is the area enclosed within the dashed line boundary. The enclosed region displays the acceptable experimental operating region for process operation and optimization. The left hand side of the enclosed region is determined by the minimum power required to generate a discharge of sufficient size to cover the substrate while the right side of the enclosed region is determined by the power required to completely cover the substrate without touching the discharge chamber walls. Thus, at each operating pressure, the right hand side of the data points represents the approximate limit of the maximum input power at that pressure before reactor wall heating becomes a problem.

Several observations can be made from the curves of FIG. 4. First, as the pressure and input power increase, the substrate temperature increases. At low pressures, the change in substrate temperature is less sensitive to input power changes than at high pressure (i.e., the slope of the lines of constant pressure increases as pressure increases). However, the substrate temperature is more sensitive to pressure changes at low pressures than at high pressures. For a fixed reactor geometry, the experimental synthesis is more sensitive to input power changes at high pressures than at lower pressures. Thus, at high pressures, the input power is preferably actively experimentally monitored to keep the process within the desired temperature deposition conditions (e.g., in a feedback control loop adjusting the input power in response to measured changes in the substrate temperature).

Figure 5:
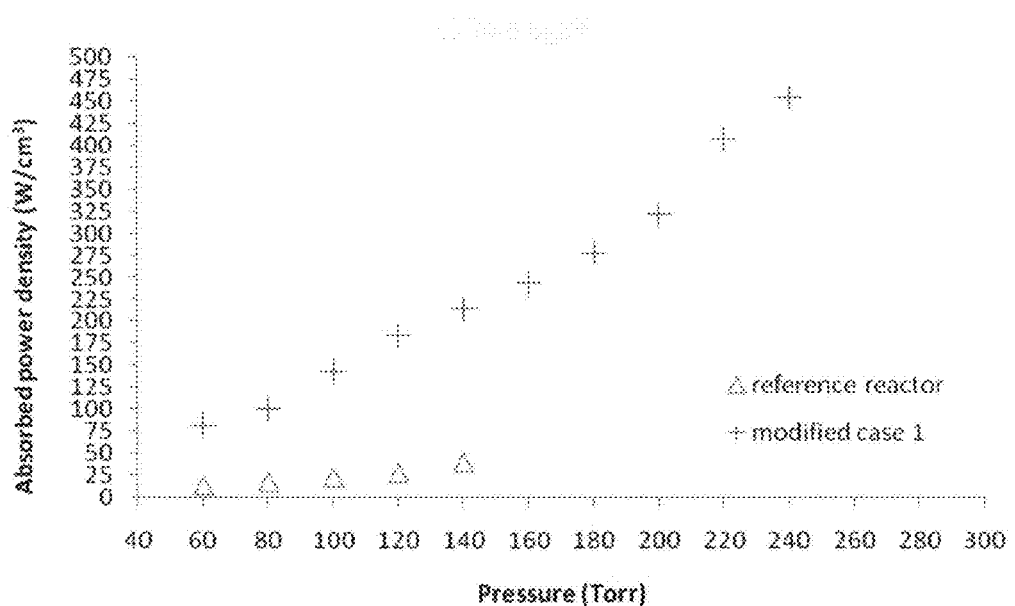
FIG. 5 illustrates absorbed plasma power density as a function of operating pressure for both the reference reactor (R3=4.13 cm and R4=5.08 cm) and the modified reactor (R3=1.91 cm and R4=3.24 cm).

Discharge power density: The discharge power density is defined as the input absorbed microwave power divided by the plasma volume. The input absorbed microwave power is determined from the difference between the incident and the reflected power meters. The plasma volume is approximated by taking length-calibrated photographs of the discharge within the allowable reactor operating region, defining the discharge volume as the volume of the brightest luminescence of the discharge, and then determining the discharge volume from the visual photographs. An example of the experimentally measured discharge power density versus operating pressure for the high pressure reactor of Example 1 is presented in FIG. 5. Here, the experimental data were taken with fixed reactor geometry where L2 was held constant at 6.13 cm as the pressure was increased from 60 Torr to 240 Torr. As shown, the discharge power density increased from about 80 W/cm$^3$ to about 500 W/cm$^3$ as the pressure increases from 60 Torr to 240 Torr. In FIG. 5, the high pressure reactor is also compared with the power densities of the reference reactor. The power densities of the redesigned reactor are much larger than similar power densities from the reference reactor. Specifically, the corresponding absorbed power densities for the reference reactor shown in FIG. 5 vary from 20 W/cm$^3$ to 45 W/cm$^3$ as the pressure increases from 60 Torr to 140 Torr [20], while the corresponding discharge power densities of the Example 1 reactor vary from 60 W/cm$^3$ to 225 W/cm$^3$ over the same lower operating pressure range. Accordingly, the reduction of the center conductor area by a factor of about 4.5 increases the power density by a factor 4-5. Thus, at a constant pressure, the reduction of the powered electrode diameter significantly increases the power density of the discharge, and the increase in power density is inversely proportional to the substrate area.

Reactor tuning: When operating at a constant pressure within the allowable deposition region shown in FIG. 4, the reactor performance can be further optimized by length-tuning the coaxial cavity (i.e., by adjusting $\Delta L$). Thus, within the allowable deposition region shown in FIG. 4, each curve can be modified by adjusting the coaxial cavity section of the applicator. When this is done, the electromagnetic focus is altered around the $Z_0$ (z=0) region, and the substrate also is moved changing by its axial position relative to the $Z_0$ plane (i.e., either above or below the plane). As the substrate position changes, the position, size, shape, and power density of the microwave discharge is also varied in a complex nonlinear fashion.

As the substrate position is lowered from a position above to a position below the $Z_0$ plane, the discharge size decreases, its position with respect to the substrate changes, its power density increases, and the substrate temperature increases. FIGS. 6 and 7 display the variations of substrate temperature and discharge power density, respectively, as a function of operating pressure as the substrate position. In the figures, $\Delta L$ varies from +4.9 mm (i.e., the substrate is above the $Z_0$ plane and closer to the excitation probe) to −4.9 mm (i.e., the substrate is below the $Z_0$ plane and further away from the excitation probe). These curves demonstrate that at a constant pressure, the substrate temperature can vary more than 300° C., and the associated plasma power density also changes dramatically. For example as shown in FIG. 7 at 240 Torr, as the substrate position is varied from +4.9 mm to 4.9 mm, the substrate temperature changes from 875° C. to 1175° C. The substrate temperature increases as the substrate is lowered below the $Z_0$ plane. As the substrate is lowered, the discharge shape is changed, its volume is reduced, and the discharge becomes more intense. The associated discharge power densities vary from about 225 W/cm$^3$ at z=+4.9 mm to 525 W/cm$^3$ at z=−4.9 mm. These experiments clearly demonstrate the ability to tune the reactor by altering the substrate temperature, the discharge position, and the power density as the coaxial cavity size is changed.

Process Optimization: A set of separate eight-hour deposition experiments was performed to investigate the deposition rate variation as a function of substrate position at a constant pressure of 220 Torr and at a constant 3% methane concentration. L1 was held constant while L2 was varied in five steps such that the substrate position ($\Delta L$) varied from +4.9 mm to −4.9 mm. The input power only varied slightly from 2.6 kW to 2.8 kW. The experimental results are displayed in FIGS. 8A and 8B. For each of the experimental data points presented in the figure, the discharge size was slightly adjusted by varying the input power to achieve uniform deposition. Generally, it is desired to have the size of the plasma discharge cover the entire substrate in order to achieve deposition uniformity. However, at higher-pressure operation, the plasma discharge size can be slightly smaller than the substrate surface area and still achieve uniform deposition. As long as the plasma hovers around and remains in good contact with the substrate, it will produce a uniform temperature distribution on the substrate and deposition uniformity.

Figure 8A:
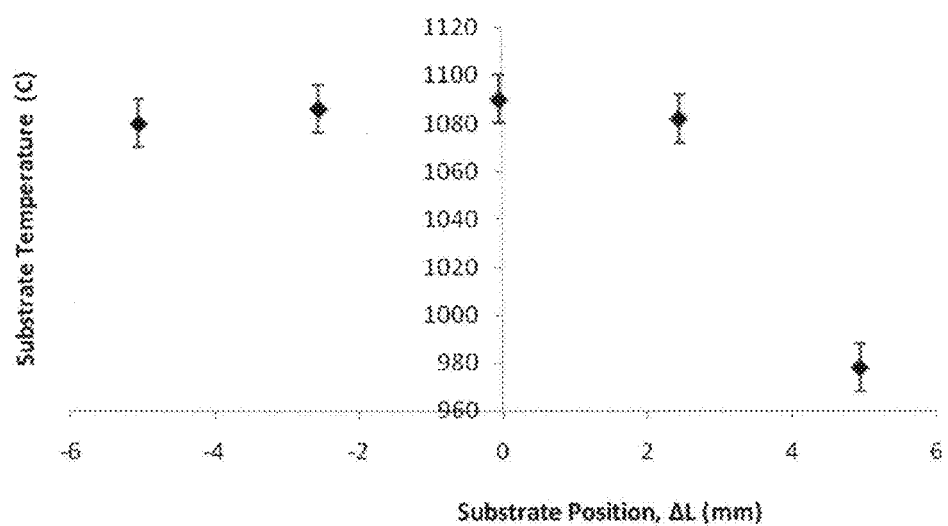
FIGS. 8A and 8B illustrate substrate temperature (8A) and diamond growth rate (8B) versus substrate position (ΔL).
Figure 8B:
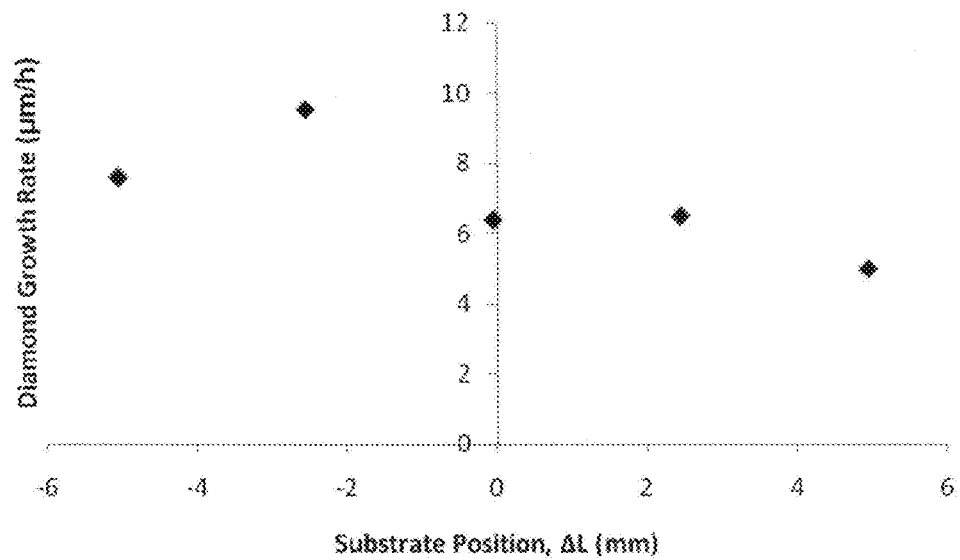

As can be observed from the measurements presented in FIGS. 8A and 8B, relatively small adjustments in L2 can have a substantial influence on the resulting deposition rate. As L2 is varied, the electromagnetic fields in the region around the $Z_0$ plane substantially change, resulting in a variation in the shape and the position of the discharge. By varying the substrate position a few millimeters, the deposition rates vary from 5.4 μm/h to 9.5 μm/h. At ΔL=−4.9 mm, the deposition rate decreases. In this case, the substrate temperature has begun to decrease since the discharge is starting to separate from the substrate. These experiments demonstrate the benefit at higher operating pressures of varying the coaxial cavity dimensions to achieve optimum diamond synthesis (e.g., uniform and high deposition rate). The very non-uniform, buoyant, and high pressure nature of the microwave plasma discharge means that the reactor preferably has the ability to control and position the discharge with respect to the substrate in order to achieve optimum deposition. Thus the reactor tuning adjustments are very useful in order to control and optimize the deposition process.

Diamond growth rates, morphology and uniformity: Diamond film synthesis was investigated over a range of process conditions and the experimental results are displayed in FIG. 9. Specifically, in a series of eight-hour experimental deposition runs, polycrystalline films were deposited on one-inch silicon wafers as pressure was varied from 180 Torr to 240 Torr and methane concentrations were varied from 2% to 5%. Input power levels (see FIG. 4) were varied from about 2 kW to about 2.5 kW as pressure and methane concentrations were varied. For each measurement, the reactor length was adjusted to yield a good deposition rate. For all the data points in FIG. 9, the rector length scales were the same (as shown in Table 1-Example 1) except for a change in ΔL. For experiments above 200 Torr, ΔL=−0.48 cm; for experiments at 200 Torr and below, ΔL=−0.31 cm. In both cases, the substrate was located below the $Z_0$ plane in order to produce good deposition rates. As is shown in FIG. 9, the linear deposition rates increase as pressure and methane concentration increase. The substrate temperature during the deposition varied from about 1030° C. to about 1150° C. for this set of operating pressures.

A comparison of these deposition rates with the lower pressure and lower power density performance of the reference reactor indicates a significant improvement in linear deposition rates. When operating at 130 Torr to 140 Torr the maximum deposition rates were about 6 μm/h using a 3% methane concentration [6, 7, 20, and 21]. According to the present disclosure, however, maximum deposition rates exceed 10 μm/h and, at the higher pressures and methane concentrations, the deposition rates are above 20 μm/h. These deposition rates also compare favorably with the rates reported at 200 Torr with a millimeter wave plasma assisted CVD reactor [24].

Figure 10A:
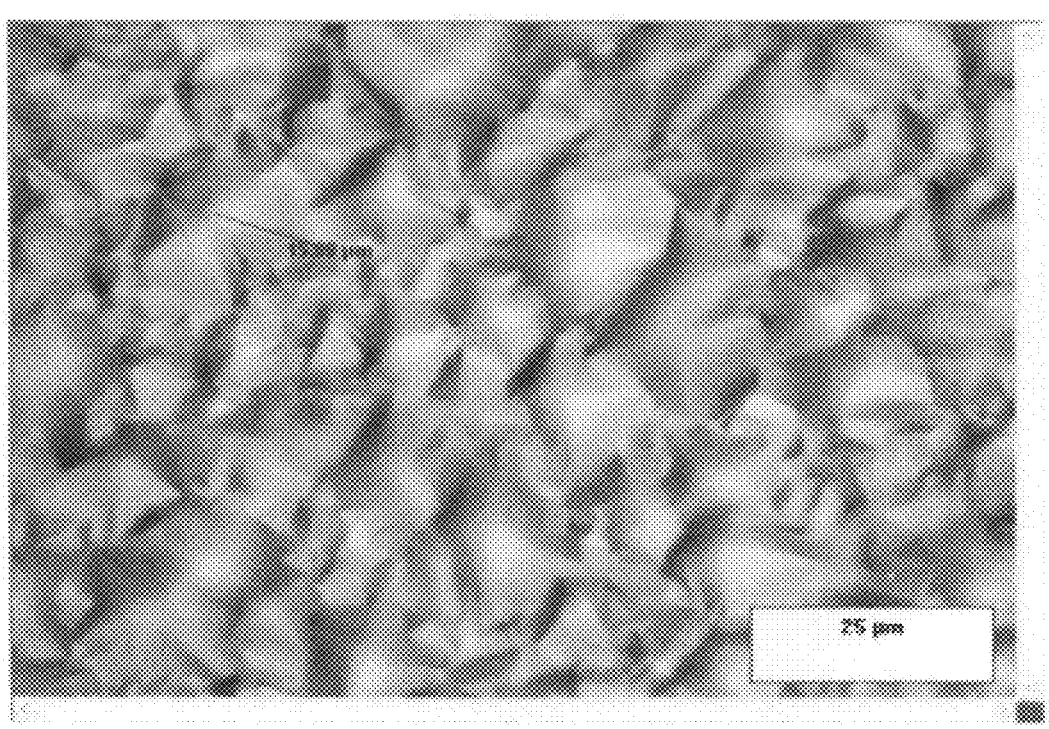
FIGS. 10A-10D illustrate optical microscope images of polycrystalline diamond grown at (10A) 180 Torr, 32 μm, 2% $CH_4/H_2$; (10B) 200 Torr, 56 μm, 3% $CH_4/H_2$; (10C) 220 Torr, 96 μm, 4% $CH_4/H_2$; and (10D) 240 Torr, 84 μm, 5% $CH_4/H_2$.
Figure 10B:
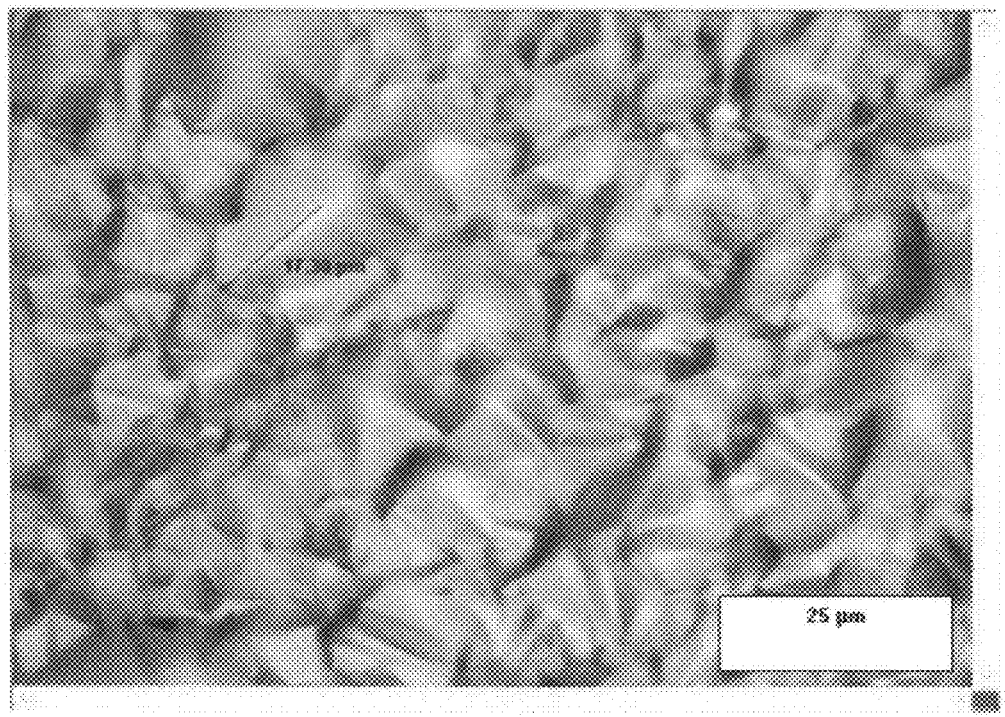
Figure 10C:
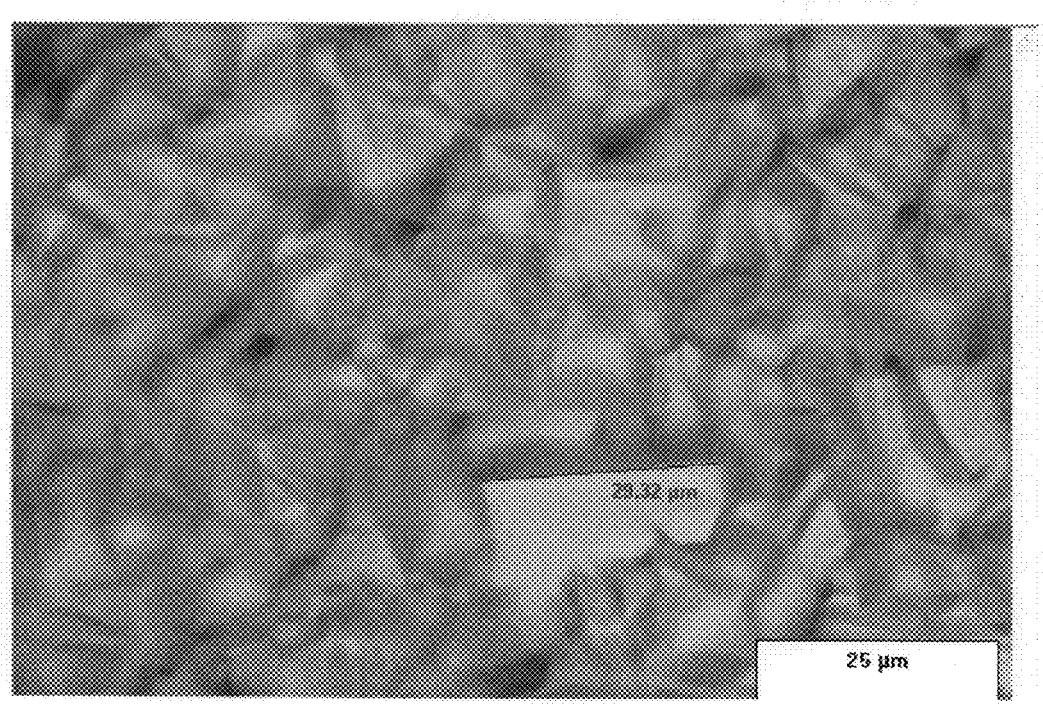
Figure 10D:
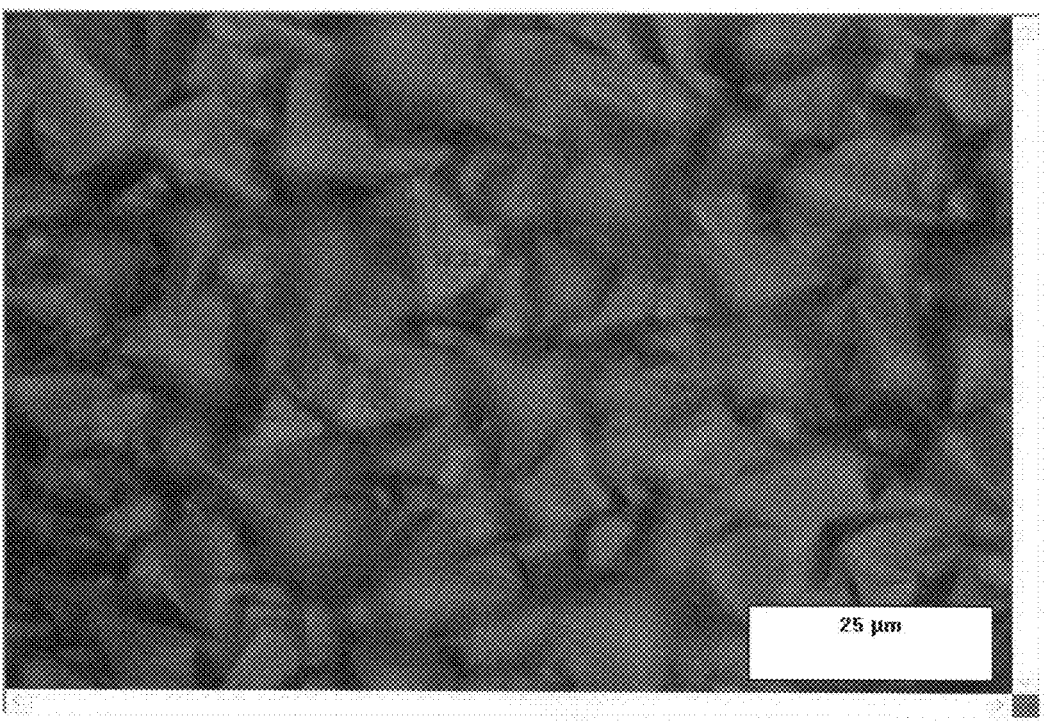

The diamond morphology was determined by analyzing the diamond samples using optical microphotographs. The grain size of the synthesized polycrystalline diamonds varies along the surface of the substrate and it is mainly dependent upon the operating pressure, gas chemistry, and deposition time. Typical grain sizes range from about 10 μm to about 50 μm for 180 Torr to 240 Torr and 2% to 5% $CH_4$ gas chemistry. As the pressure increases, the grain size tended to increase up to several tens of micrometers. The polycrystalline grown diamond mostly exhibits a pyramidal shape, as shown in FIGS. 10A to 10B, with the thickness of the polycrystalline diamond layers ranging from 32 μm to 128 μm.

Figure 11A:
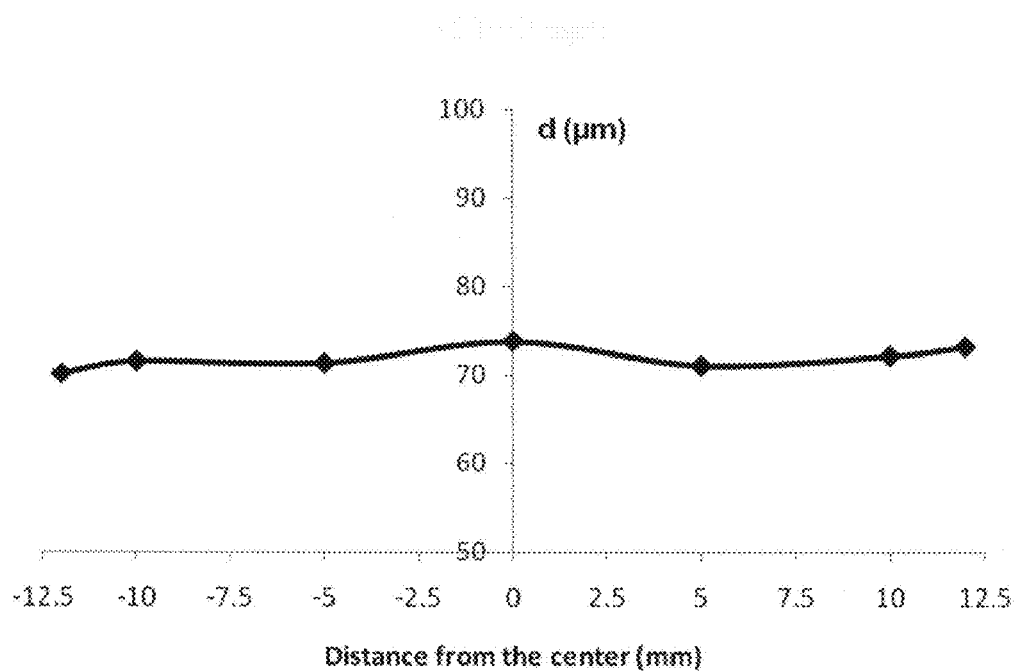
FIGS. 11A and 11B illustrate diamond film uniformity for a 25.4 mm-diameter substrate (11A: radial distribution of film thickness (d in μm); 11B: circumferential distribution of film thickness (d in μm) at a radial position 12 mm from the substrate center).
Figure 11B:
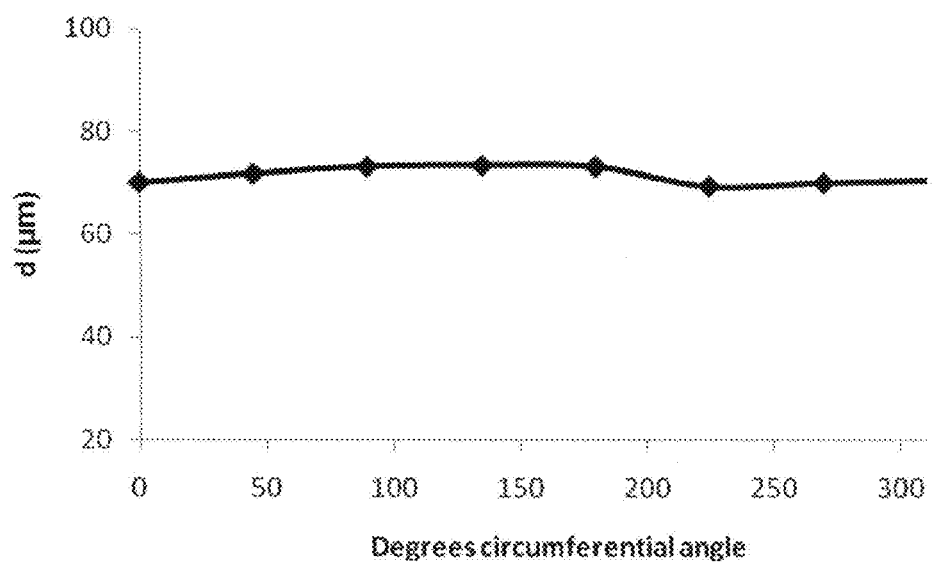

The grown diamond uniformity is deduced from the diamond thickness profile. The thickness distribution is determined by using a tip connected to a Solarton linear encoder. Prior to diamond deposition, the non growth surface of the substrate was marked and the thickness of the brand new silicon wafer measured at several points both in radial and circumferential directions. After the deposition, the exact same points on the substrate were re-measured to obtain the final diamond thicknesses. FIGS. 11A and 11B show the radial and circumferential diamond film uniformity for a film of 73 μm nominal thicknesses on a 25.4 mm diameter substrate with an operating pressure of 220 Torr and a source gas flow of 400 sccm $H_2$ and 12 sccm $CH_4$ (i.e., 3% methane). The L1=5.65 cm, L2=6.05 cm, $L_s$=20.3 cm, $L_p$=3.8 cm, with a microwave absorbed power of 2.3 kW and a substrate temperature of 1120° C. As shown, a good uniformity of grown diamond can be achieved at this operating high pressure, similar to the deposition at lower pressures. The variation in the thickness uniformity across the substrate surface was ±1.30 μm radially and ±1.63 μm circumferentially at a radial distance of 12 mm. These variations are determined based on maximum and minimum thickness values across the substrate surface points.

Diamond quality: Diamond quality was determined from visual observations of the color and transparency of the freestanding films, from the Raman scattering spectrum of the films, and from optical and IR transmission measurements of freestanding films. The freestanding films were produced by removing the silicon substrate by placing the deposited film and substrate into a wet etching solution of nitric acid, deionized water, and hydrofluoric acid. In order to reduce the surface roughness and produce a smoother flat diamond surface some of the samples were polished and lapped prior to back etching. This allowed more accurate measurements on the IR transmission.

Figure 12A:
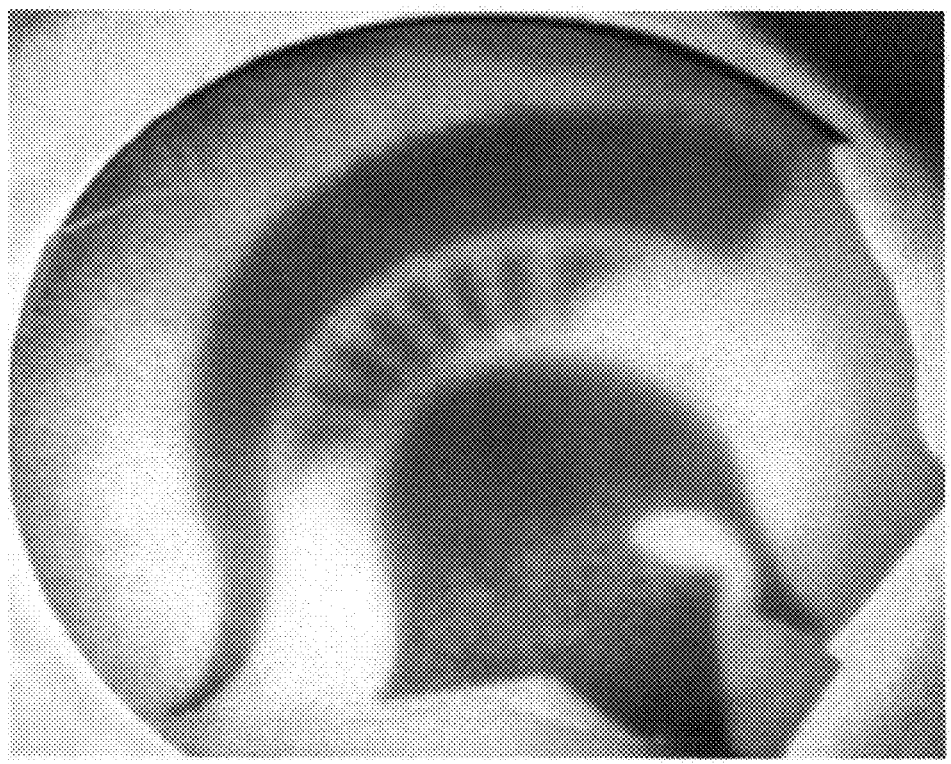
FIGS. 12A-12D illustrate polycrystalline diamond over a graphic logo (12A: unpolished, 32 μm, 2% $CH_4/H_2$ at 180 Torr; 12B: unpolished, 68 μm, 3% $CH_4/H_2$ at 180 Torr; 12C: unpolished, 133 μm, 4% $CH_4/H_2$ at 180 Torr; 12D: polished, 2% $CH_4/H_2$ at 200 Torr).
Figure 12B:
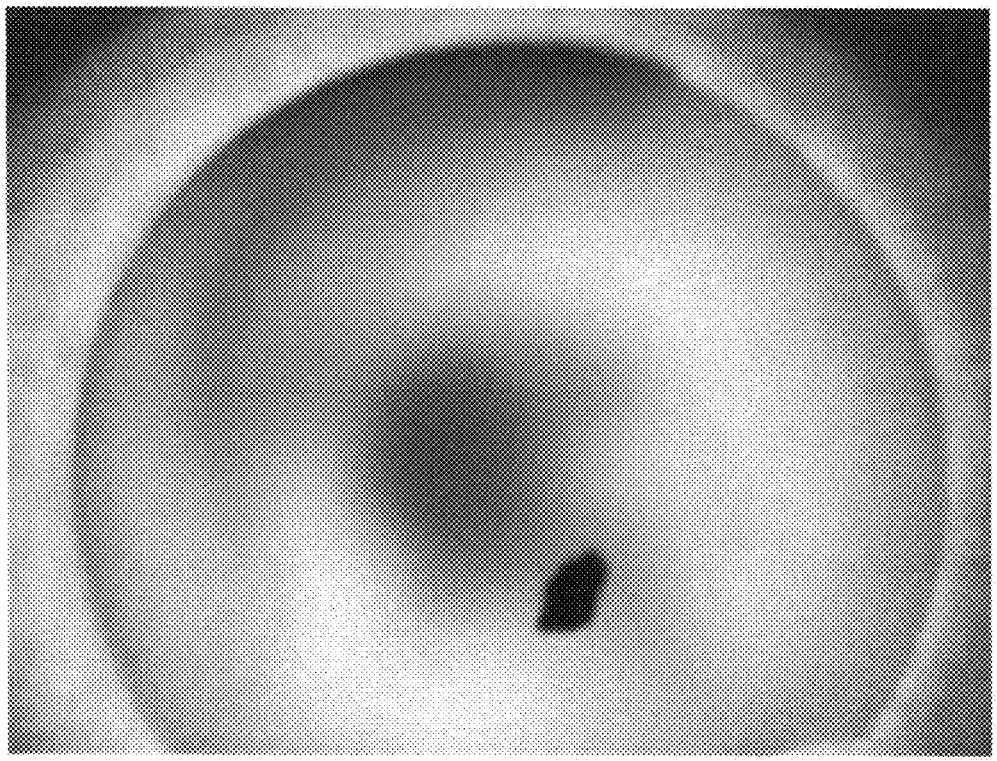
Figure 12C:
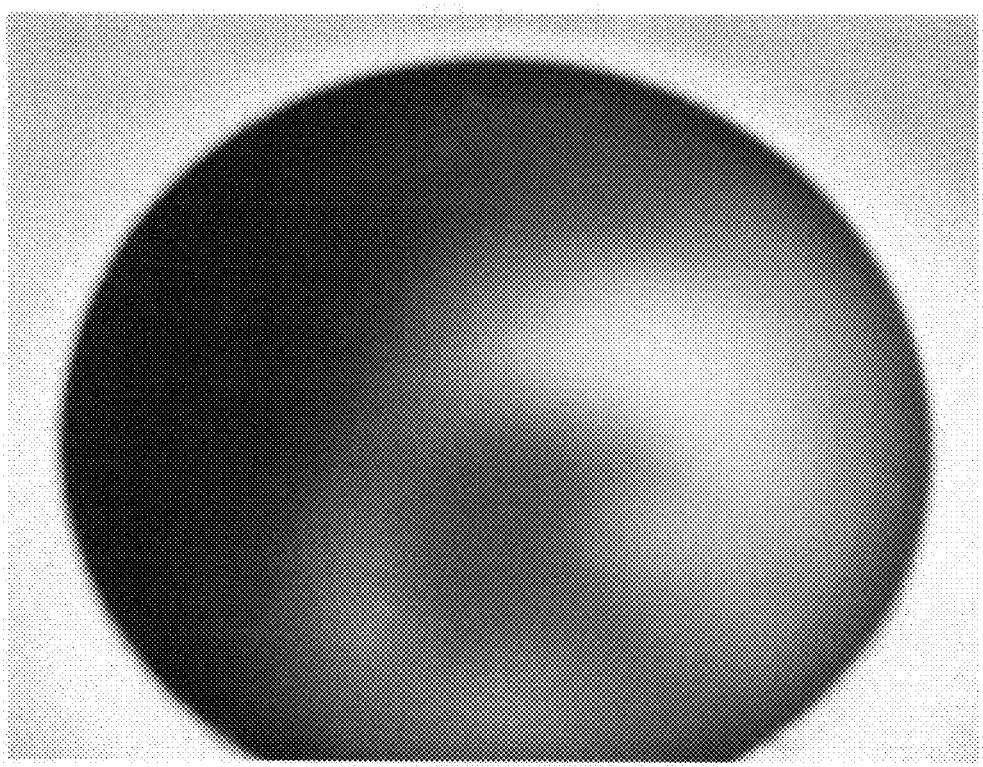
Figure 12D:
Figure 12E:
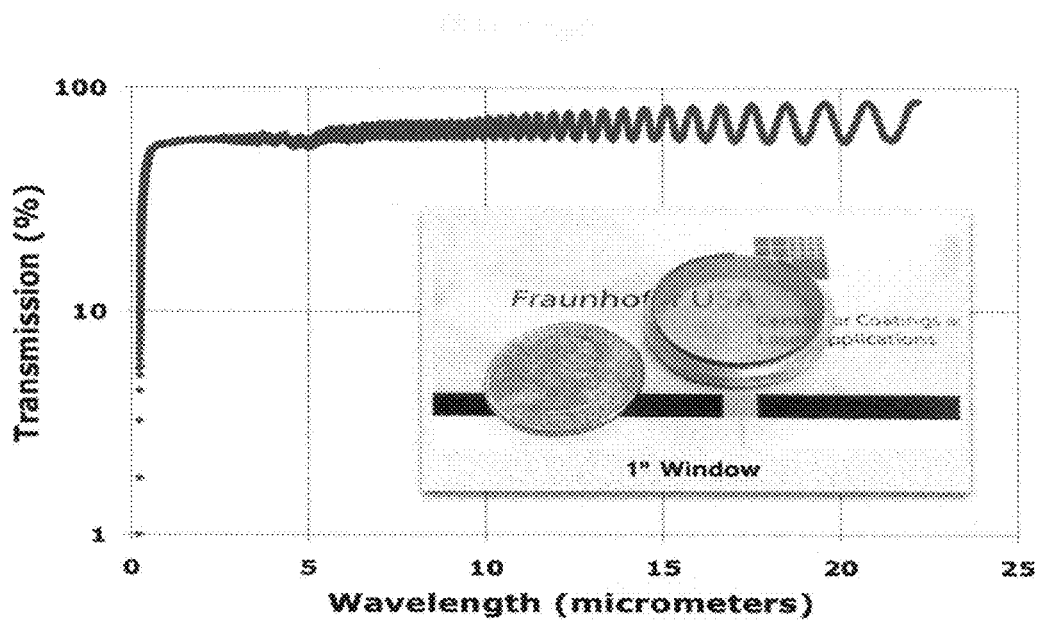
FIGS. 12E and 12F illustrate FTIR and UV transmission spectra for polycrystalline diamond deposited at 200 Torr and 2% methane.
Figure 12F:
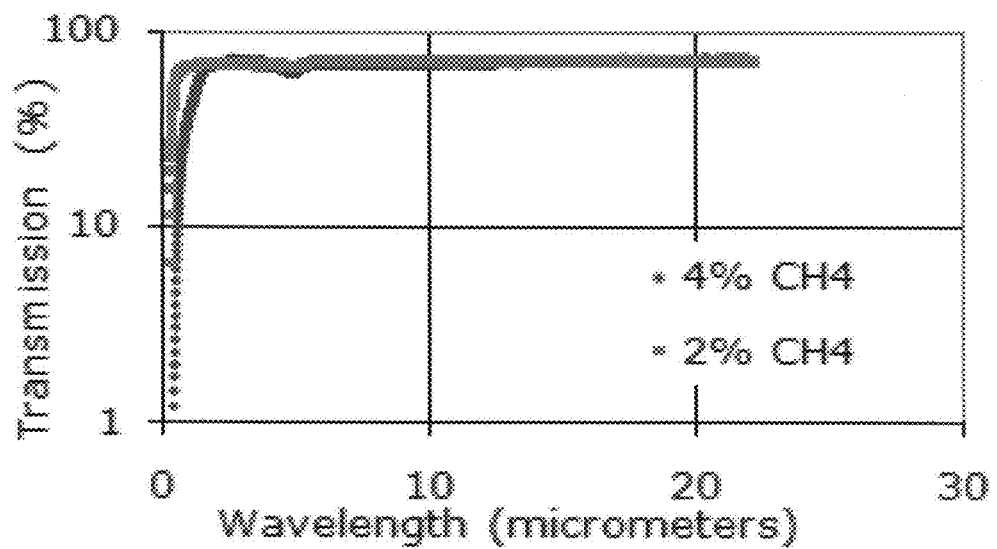

In terms of diamond transparency quality, when the source gas chemistry is varied from 2% to 4% at a fixed operating pressure of 180 Torr, several freestanding polycrystalline diamond films were obtained as shown in FIGS. 12A to 12C. These grown diamonds are smooth on the nucleation side and rough on the growth side since they are unpolished. As is visually apparent, the transparency of the grown diamond decreases as the gas chemistry increases from 2% to 4% methane and the film thickness correspondingly increases from 32 μm to 133 μm. The quality of the 2% and 3% films appears to be good, since one can see through them and they are also white. Hence, lower gas chemistry concentration results in higher freestanding diamond quality at this pressure regime. FIG. 12D is a polished (to a final thickness of about 70 μm) and lapped freestanding diamond film grown at 200 Torr, with 2% methane concentration, 30 hours deposition time, and a growth rate of 3.5 μm/h. As can be seen, the grown diamond exhibits a good visual transparency showing the graphic logo underneath the film sample. Transmission spectra for the polycrystalline diamond window grown at 200 Torr and 2% methane are shown in FIG. 12E. The photo inset displays a free standing diamond film after being polished, lapped and silicon substrate removal via chemical etching. The highly monochromatic FTIR region of the data shows interference maxima and minima about an average of approximately 71% in the mid-IR, as expected for a diamond refractive index of 2.38. The UV transmission drops to zero upon the onset of band-gap absorption at 222 nm. The absorption observable between approximately 3 and 5 micrometers is principally due to two-phonon absorption that occurs in intrinsic diamond. The transmission of 2% $CH_4$ shows better results in the UV than the 4% $CH_4$ (FIG. 12F).

Figure 13:
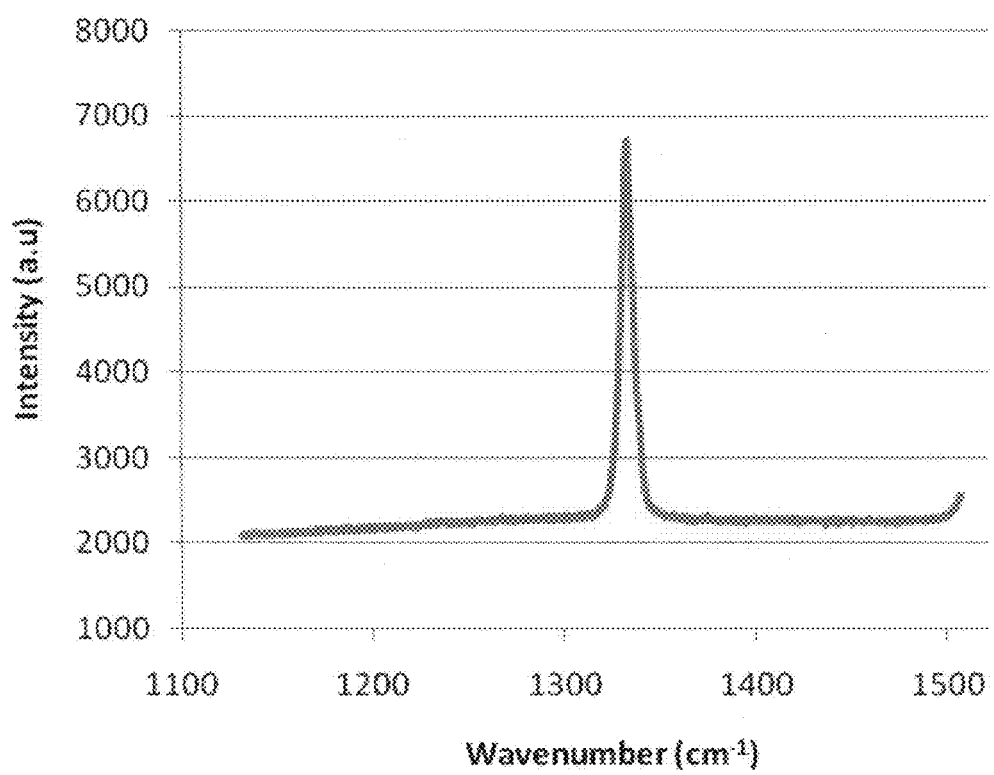
FIG. 13 illustrates the Raman spectrum for polycrystalline diamond grown at 3% $CH_4/H_2$ and 220 Torr.

The deposited diamond is also characterized using the Raman method (argon green laser excitation wavelength of 514.5 nm). Shown in FIG. 13 is a representative Raman spectrum for the polycrystalline diamond sample grown at 220 Torr and 3% methane. It exhibits a strong diamond peak at 1332.5 cm$^{-1}$, with a full-width-at-half-maximum (FWHM) value of 7.1 cm$^{-1}$. Additional Raman readings (not shown) for polycrystalline diamond grown at 240 Torr and 2% methane have a FWHM value of 4.6 cm$^{-1}$.

Figure 14A:
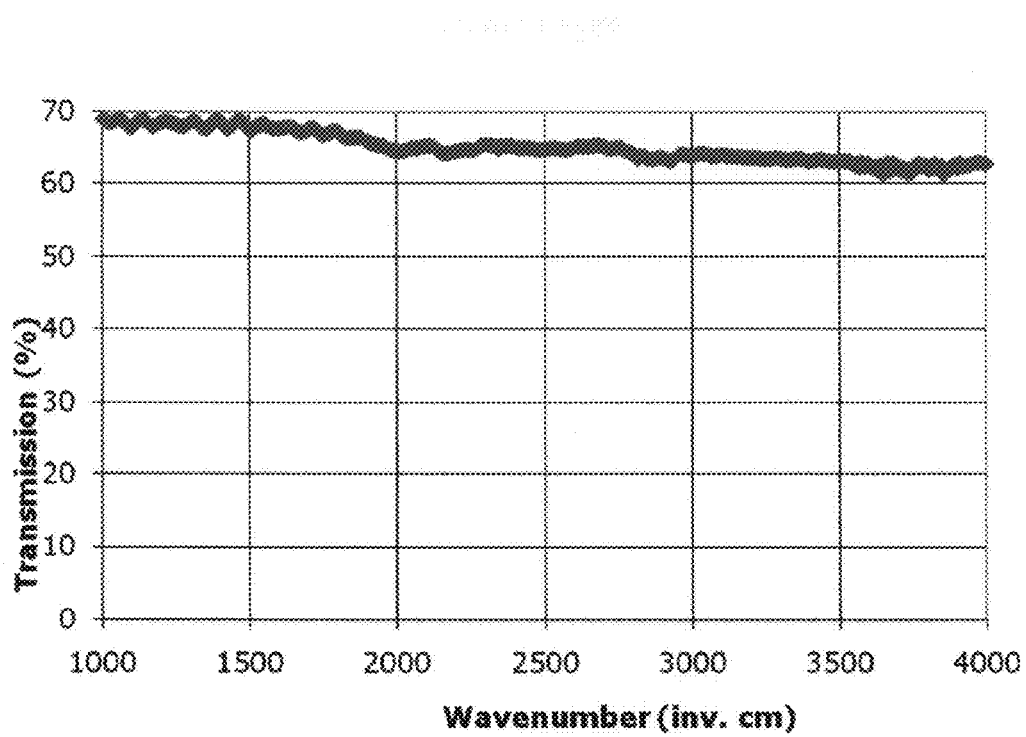
FIGS. 14A and 14B illustrate FTIR infrared (14A) and visible (14B) spectra for polycrystalline diamond deposited with 4% $CH_4/H_2$ at 220 Torr; in the visible spectrum, crosses represent measured points, the upper dashed line represents model results for a 20 nm surface roughness, and the lower dashed line represents model results for a 30 nm surface roughness.
Figure 14B:
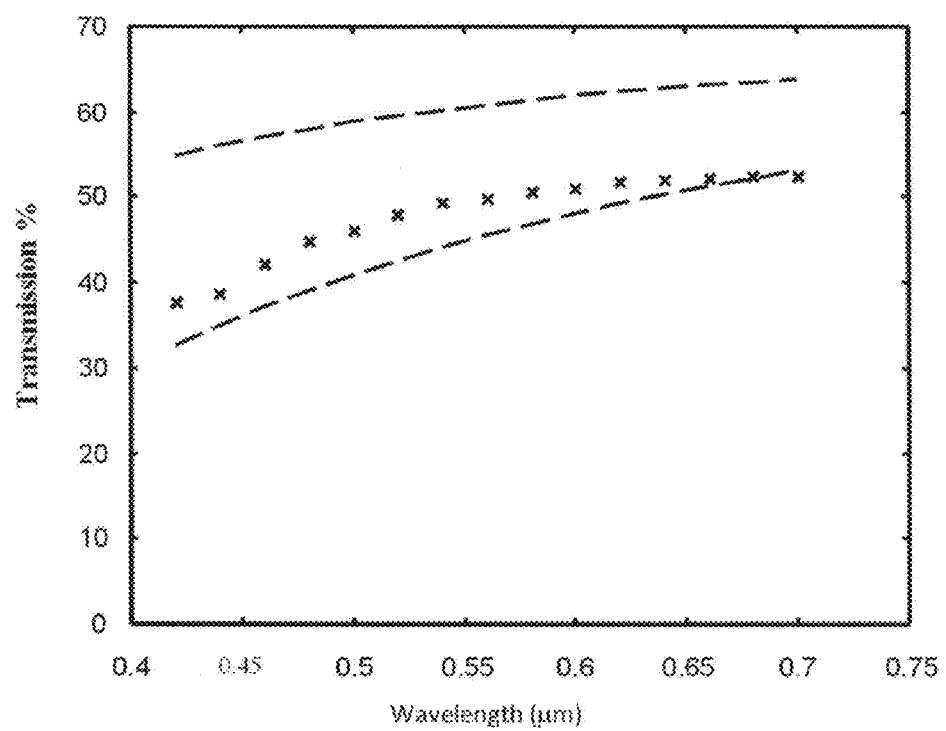

By further increasing deposition pressure, improved quality is achieved with higher methane concentrations. FIGS. 14A and 14B show the optical transmission of a polycrystalline diamond layer grown at 220 Torr and 4% methane concentration with a thickness of 26 μm after being polished and lapped. FIG. 14A shows the infrared (IR) transmission through the sample. At longer IR wavelengths, the transmission approaches the ideal value of approximately 71% for lossless diamond with a refractive index equal to 2.38. In the visible portion, as shown in FIG. 14B, the transmission drops to approximately 35% in the violet portion of the spectrum. Analysis indicates that the drop-off may be largely explained by surface roughness considerations. The effect of surface roughness on transmission is calculated using a model reported previously [21]. Surface profilometer measurements with a 4.8 mm scan length and a high-pass filter of 20 μm yielded polished surface roughness results of approximately 30 nm for this sample. Surface roughness values of the unpolished nucleation of the sample are approximately 12 nm. Model calculations based on a polished surface roughness of 20 nm and 30 nm are also shown in FIG. 14B (dashed lines) for comparison. The data points (crosses) largely fall between these bounds, indicating that the visible transmission is largely determined by surface roughness considerations. This was also the case for earlier reported diamond layers grown at 120 Torr with 1.0% to 1.5% methane [21]. Thus the optical transmission of the diamond films grown with 4% methane at 220 Torr is comparable to the transmission of diamond film grown with significantly lower methane concentrations at lower pressures.

Example 7

Single Crystal Diamond Deposition

The reactor of Example 1 was tested for its ability to deposit single crystal diamond at high operating pressures. The single crystal diamond sits on a substrate holder similar in size to that used for the deposition of polycrystalline diamond. In general, the power density for the single crystal experiments is expected to be about the same as that for the polycrystalline diamond examples.]

The experimental procedures (e.g., start-up, operation, tuning, optimization) for the deposition of single crystal diamond are generally the same as described for the deposition of polycrystalline diamond in Example 6. The main difference is that the substrate is a 3.5 mm×3.5 mm single crystal diamond seed substrate. The substrate is a yellow high-pressure, high-temperature (HPHT) single crystal seed that is pre-treated with an acid cleaning/$H_2$-plasma etch procedure and then used as a basis for the homoepitaxial growth of the single crystal diamond.

The reactor of Example 1 was used for the single crystal diamond deposition and had the geometric parameters specified in Table 1. For the particular results presented in this example, ΔL was about −2 mm to −3 mm. The experimental pressure variation ranged between 180 Torr and 260 Torr, and the microwave input power was about 1.8 kW.

Hydrogen and methane were the synthesis gases, and the percentage of methane was 3 mol. % or 5 mol. % $CH_4$ relative to $H_2$. The hydrogen flow rate was fixed at 400 sccm and methane flow was 12 sccm or 20 scam. The resulting substrate temperatures ranged from about 1000° C. to about 1200° C.

Figure 15A:
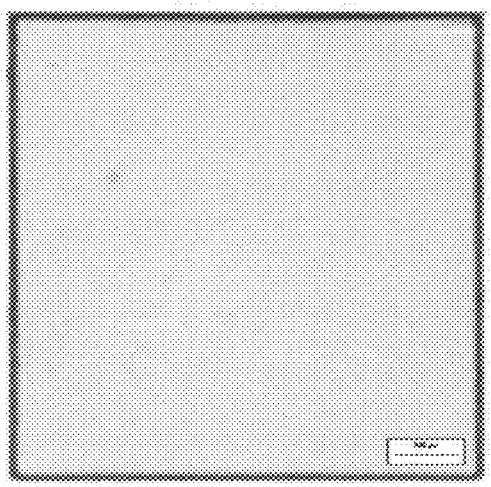
FIGS. 15A and 15B present images of (15A) single crystal diamond seed, (15B) single crystal diamond grown at 200 Torr with 3% $CH_4/H_2$, and (15C) single crystal diamond grown at 240 Torr with 3% $CH_4/H_2$.
Figure 15B:
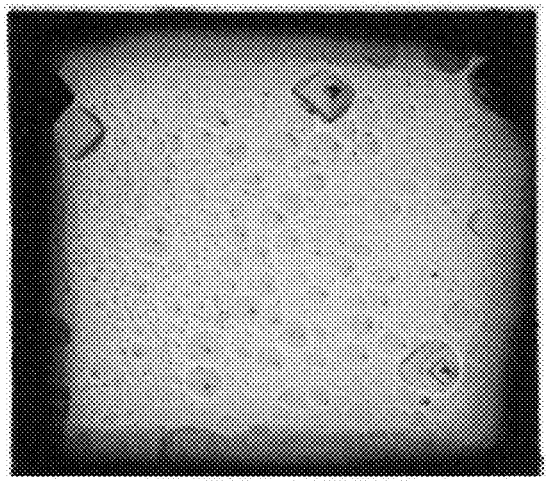
Figure 15C:
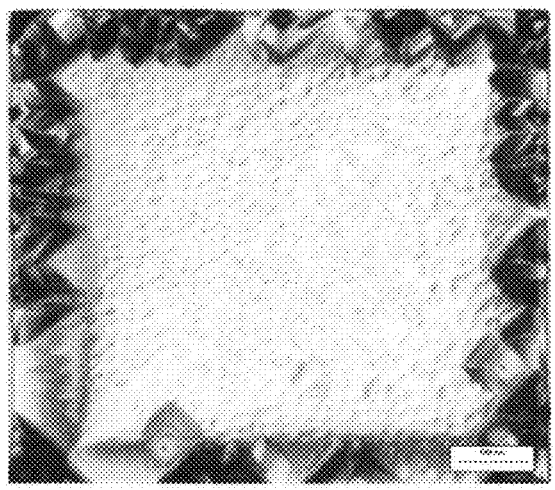
Figure 16:
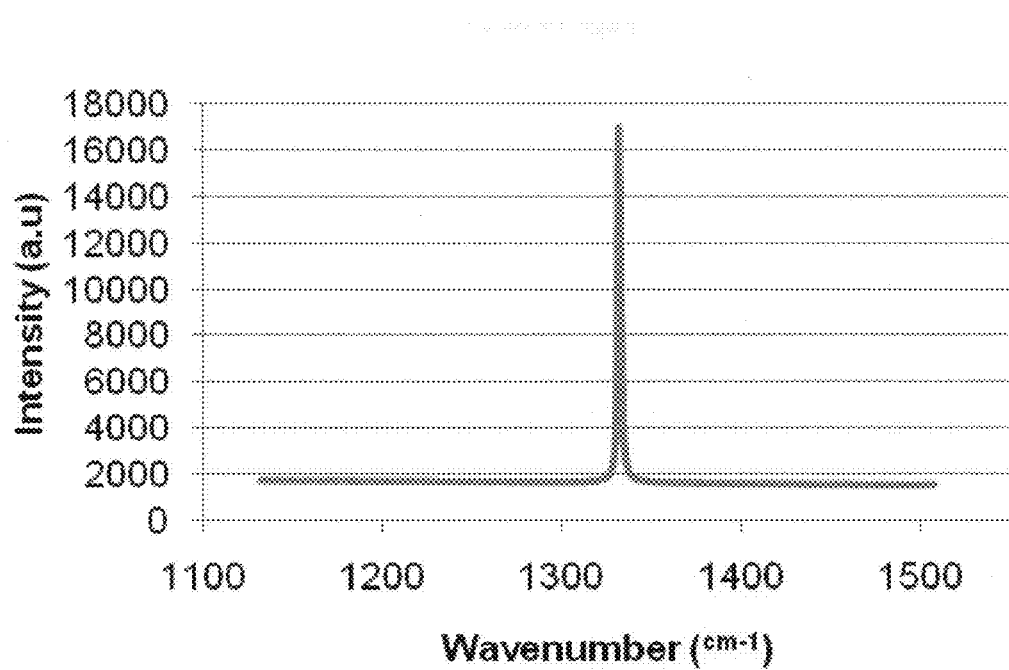
FIG. 16 illustrates the Raman spectrum for single crystal diamond grown at 3% $CH_4/H_2$ and 220 Torr.
Figure 17A:
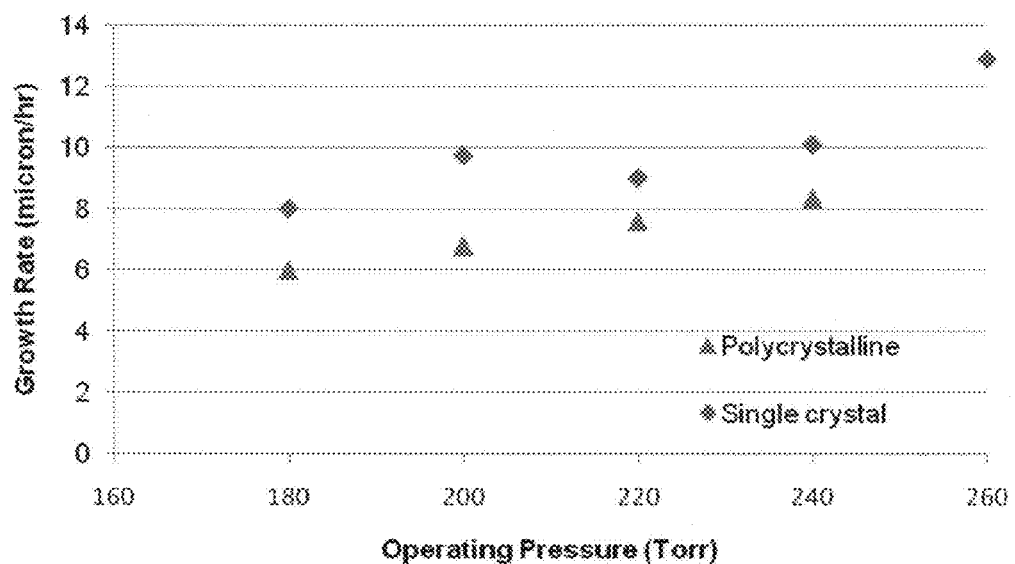
FIGS. 17A and 17B illustrate single crystal diamond growth rates as a function of operating pressure (17A: 3% $CH_4/H_2$ comparing PCD and SCD rates; 17B: 3% and 5% $CH_4/H_2$ SCD rates). (no addition of nitrogen gas).
Figure 17B:
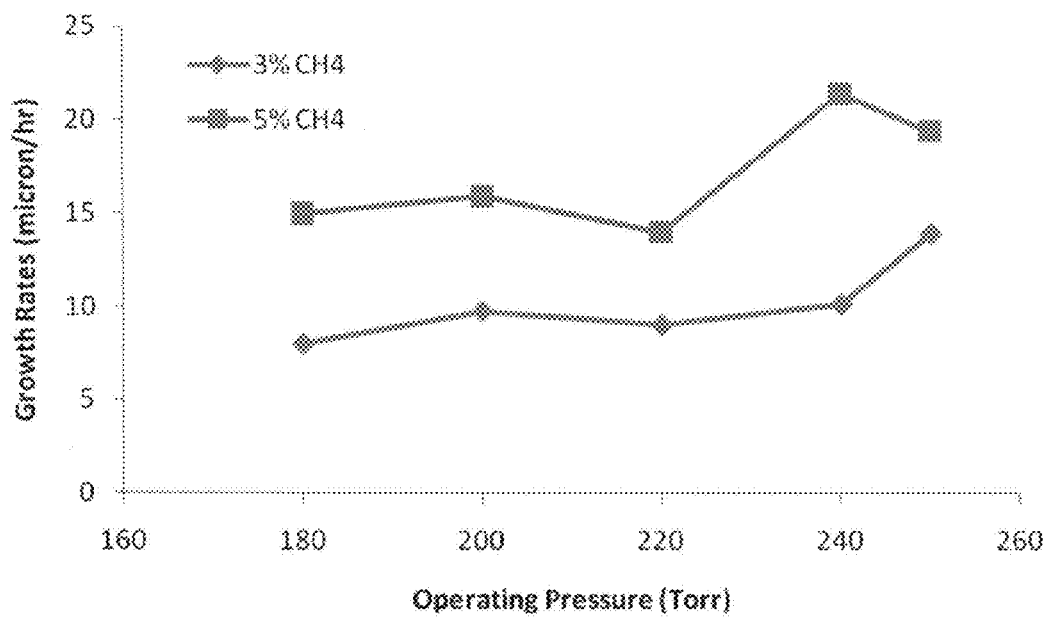

FIGS. 15A to 15C are images of the 3.5 mm×3.5 mm substrate (A) prior to deposition (i.e., the single crystal diamond seed), (B) after deposition of single crystal diamond grown at 200 Torr, and (C) after deposition of single crystal diamond grown at 240 Torr. FIG. 16 illustrates the Raman spectrum for single crystal diamond grown at 3% $CH_4/H_2$ and 220 Torr. It exhibits a strong diamond peak at 1332.33 cm$^{-1}$, with a full-width-at-half-maximum (FWHM) value of 1.82 cm$^{-1}$. By comparison, the HPHT seed had a FWHM value of 1.80 cm$^{-1}$. FIGS. 17A and 17B compare the resulting single crystal diamond growth rates as a function of operating pressure with the analogous data measured for polycrystalline diamond deposition at 3% and 5% methane. The single crystal diamond growth rates are about 10%-15% higher than those for PCD growth (e.g., ranging from about 8 μm/h to about 13 μm/h at 3% methane and about 15 μm/h to about 22 μm/h at 53% methane). Certain impurities and defects in diamond have characteristic absorption signatures in the mid-infrared region of the FTIR infrared spectrum. The existence or absence of absorption peaks in a given spectrum (i.e., relative to a known standard, for example the single crystal seed) is a valuable indicator of diamond quality. FTIR infrared spectra for the seed diamond and the deposited diamonds (not shown) had similar characteristic absorption spectra (i.e., no new peaks detected and no peaks missing), indicating that the grown single crystal diamond was of high quality.

Example 8

Single Crystal Diamond Deposition

The 2.45 GHz reactor of Example 1 was tested for its ability to deposit single crystal diamond with the addition of small amounts of nitrogen to the methane/hydrogen source gas. The deposition substrate is an HPHT single crystal seed similar to that used in Example 7. Suitable source gas compositions include about 2% to 10% $CH_4/H_2$ with an additional 100 ppm to 700 ppm $N_2$. Specific source gas compositions are summarized in Table 2 below and the accompanying figures. The input microwave power ranges from 1.5 KW to 3 kW with operating pressures from about 180 Torr to about 250 Torr, resulting in applied power densities of about 160 W/cm$^3$ to about 500 W/cm$^3$. Water cooling of the substrate maintains the substrate temperature from about 950° C. to about 1250° C.

Figure 18A:
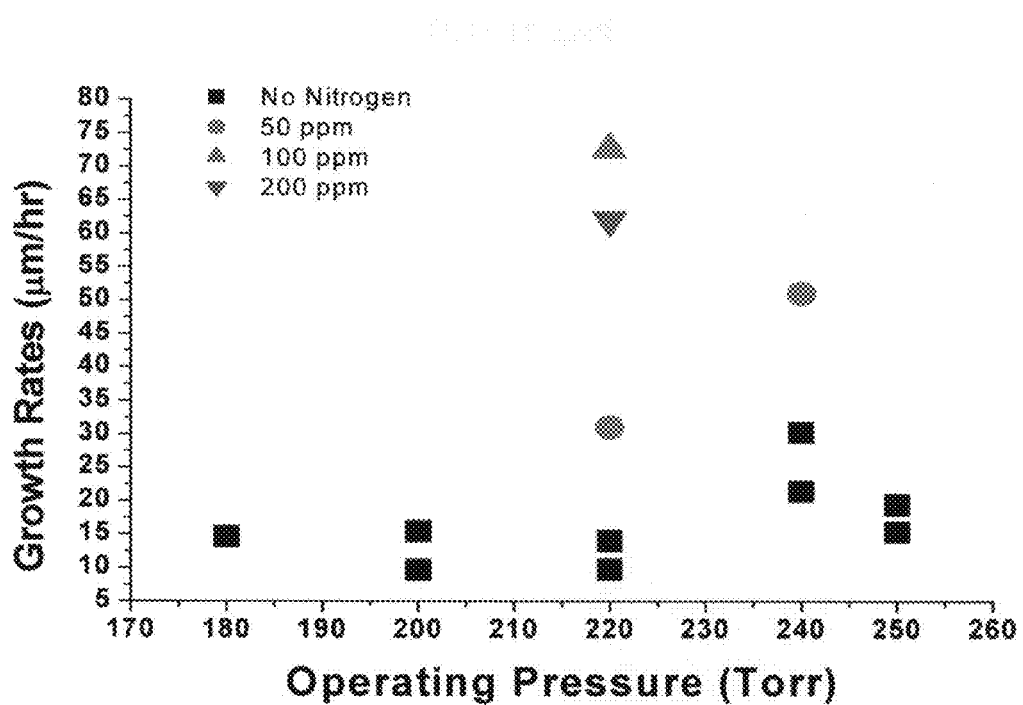
FIGS. 18A and 18B illustrate single crystal diamond growth rates with $N_2$ added to source gas (18A: growth rate as a function of operating pressure at 5% methane and variable nitrogen; 18B: growth rate as a function of nitrogen content at 5% and 7% methane).
Figure 18B:
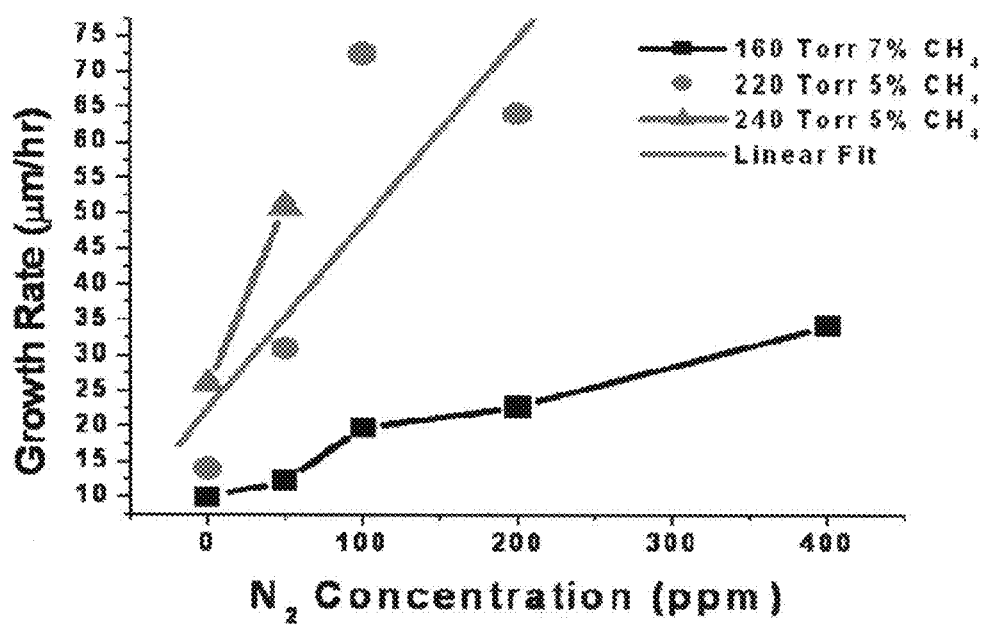
Figure 18:
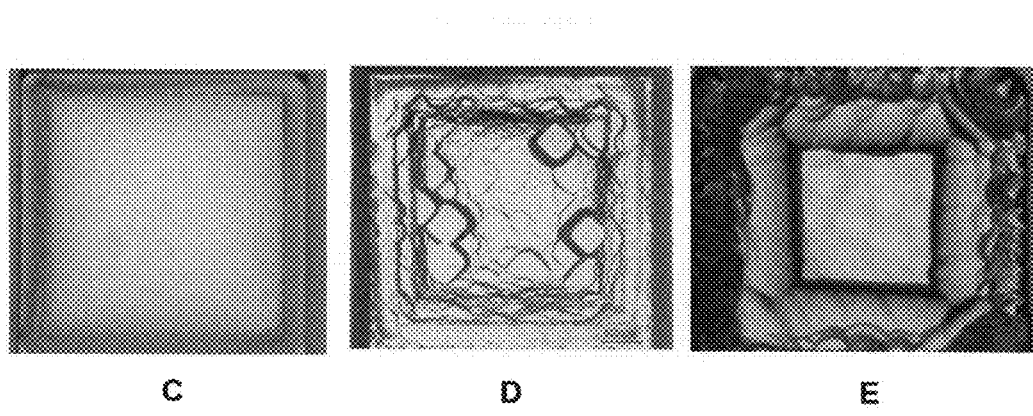
FIGS. 18C-18E present images of (18C) single crystal diamond grown at 200 Torr with 3% $CH_4/H_2$, (18D) single crystal diamond grown at 220 Torr with 5% $CH_4/H_2$ and 50 ppm $N_2$, and (18E) single crystal diamond grown at 220 Torr with 5% $CH_4/H_2$ and 100 ppm $N_2$.

Table 2 and FIGS. 18A and 18B summarize the effects of adding nitrogen to the otherwise binary mixture of methane/hydrogen source gas. In Table 2, methane and hydrogen are fed as essentially pure gases at the indicated flow rates; the nitrogen flow rate represents the flow of a dilute (100 ppm) mixture of nitrogen in a hydrogen carrier. In general, the addition of nitrogen to a methane-rich source gas at high operating pressure increases the growth rate of single crystal diamond, with growth rates about 10%-30% higher than polycrystalline diamond under the same conditions. As a result of an increase in the plasma power density by a factor of about 4-6 relative to the reference reactor (Example 2), the synthesis of optical quality films about 6-7 times faster than the reference reactor is possible. The reactor power efficiency for highest growth rate at 160 Torr is 6.3 mm$^3$/hr-kW. When the pressure was increased to 220 Torr, the power efficiency could go up to 6.9 and 16.7 mm$^3$/hr-kW for experiments with and without nitrogen addition, respectively. The power efficiency was estimated by the growth rate and input power. FIGS. 18C-18E present corresponding images of single crystal diamond grown with varying amounts of nitrogen added (FIG. 18C: 200 Torr with 3% $CH_4/H_2$ and no nitrogen, 8.6 µm/h resulting growth rate; FIG. 18D: 220 Torr with 5% $CH_4/H_2$ and 50 ppm $N_2$, 31.0 µm/h resulting growth rate; FIG. 18E: 220 Torr with 5% $CH_4/H_2$ and 100 ppm $N_2$, 72.5 µm/h resulting growth rate).

of about 4.5 increased the discharge power density by a factor of 5-8 over the reference design when operating at pressures of 100 Torr to 160 Torr and produced very intense hydrogen gas discharges with adjustable power densities of 200 W/cm$^3$ to 550 W/cm$^3$ in the 180 Torr to 240 Torr pressure regime. The length tuning of the powered electrode allowed the electromagnetic focus to be varied above the substrate and allowed the control of the discharge shape, size and position. The experiments demonstrated that small changes of a few mm in powered electrode position could change the deposition rate by a factor of two and the optimal deposition position varied as pressure and power varied. Thus the length tuning provided an important experimental variable for process control and optimization especially in the high-pressure regime.

Polycrystalline diamond film synthesis rates varied from 3 µm/h to 21 µm/h as the methane concentration was varied from 2% to 5%. The diamond growth rate increased with increasing operating pressure and higher methane concentration. These growth rates are significantly higher than the comparable growth rates of 1 µm/h to 6 µm/h in the lower and moderate pressure, lower power density MCPR. More importantly, the experimental "methane window" in which high quality optical diamond films could be synthesized increased

TABLE 2

SCD Synthesis with Nitrogen addition

| Run # | P (Torr) | Source Gas (sccm) $H_2$ | $CH_4$ | $N_2$ | Growth (hours) | Subst. T (° C.) | Ave. Thick. (µm) | Growth Rate (µm/h) |
|---|---|---|---|---|---|---|---|---|
| 1 | 200 | 400 | 12 | 0 | 8 | 1035 | 69 | 8.6 |
| 2 | 200 | 400 | 20 | 0 | 5 | 1016 | 49 | 9.7 |
| 3 | 220 | 400 | 20 | 0 | 7 | 1046 | 68 | 9.8 |
| 4 | 180 | 400 | 20 | 0 | 8 | 1017 | 120 | 15.0 |
| 5 | 240 | 400 | 20 | 0 | 8 | 1120 | 242 | 30.3 |
| 6 | 250 | 400 | 20 | 0 | 8 | 1121 | 123 | 15.4 |
| 7 | 240 | 400 | 20 | 0 | 8 | 1134 | 171 | 21.4 |
| 8 | 250 | 400 | 20 | 0 | 8 | 1137 | 156 | 19.5 |
| 9 | 220 | 400 | 20 | 0 | 8 | 1063 | 112 | 14.0 |
| 10 | 200 | 400 | 20 | 0 | 8 | 1060 | 124 | 15.5 |
| 11 | 220 | 400 | 20 | 2 | 8 | 1081 | 248 | 31.0 |
| 12 | 220 | 400 | 20 | 4 | 8 | 1170 | 581 | 72.6 |
| 13 | 220 | 400 | 20 | 8 | 8 | 1156 | 318 | 64.0 |
| 14 | 240 | 400 | 20 | 2 | 8 | 1120 | 408 | 51.0 |

Example 9

Nanocrystalline Diamond Deposition

Figure 19:
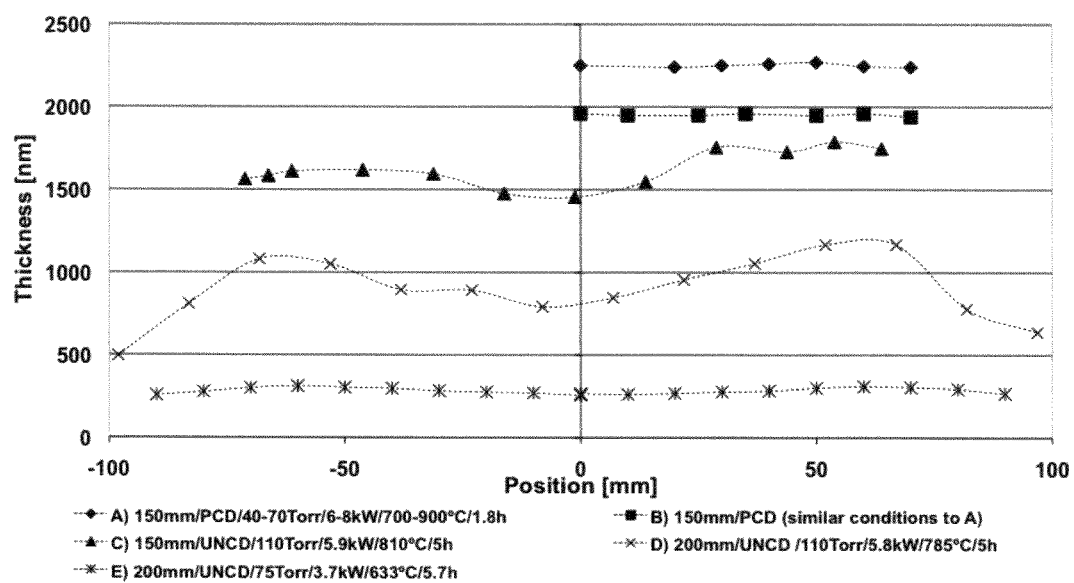
FIG. 19 illustrates nanocrystalline and polycrystalline diamond deposition thickness and uniformity at moderate operating pressures and using a microwave chamber cylinder having two cylindrical subsections having different radii.

The reactor of Example 5 was tested for its ability to deposit nanocrystalline diamond at high operating pressures. A source gas of about 1% $CH_4$ and about 1% $H_2$ relative to an argon (Ar) carrier gas was fed to the reactor at moderate temperatures ranging from 40 Torr to 110 Torr. The deposition process and characteristics are summarized in Table 3 and FIG. 19.

TABLE 3

Nanocrystalline Diamond Synthesis
Process parameters and measured average deposition rates and uniformities

| Process | Wafer size [mm] | Pressure [Torr] ([kPa]) | Power absorbed [kW] | Temperature [° C.] | Deposition rate [nm/h] | Thickness variation $^a$[%] |
|---|---|---|---|---|---|---|
| UNCD | 150 | 110 (14.7) | 1.9-6.7 | 696-810 | 80-460 | 8-13 |
| UNCD | 200 | 75-110 (10-14.7) | 3.6-5.8 | 633-785 | 30-180 | 6-21 |
| PCD | 150 | 40-70 (5.3-9.3) | 3-8 | 700-940 | 320-390 | 4-15 |

$^a$Thickness variations are calculated as percentage of the standard deviation from the average thickness across the wafers.

Summary. A new high pressure and high power density MPCR reactor is disclosed and has been experimentally evaluated by depositing PCD on silicon substrates over the 180 Torr-240 Torr pressure regime. The disclosed reactor has (1) a reduced-diameter substrate holder powered electrode and (2) independently length-adjustable/tunable powered electrode (coaxial stage) and lower conducting short components. The reduction of the powered electrode area by a factor as pressure and power increased. Optical quality films were produced with methane concentrations as high as 4% and at growth rates of 12 µm/h to 14 µm/h. Thus, high quality films were synthesized about 6-7 times faster than the equivalent films grown at 110 Torr to 130 Torr in the reference reactor. These growth rates were similar those reported using a high power millimeter-wave plasma reactor at 200 Torr [28]. Thick freestanding transparent films were produced with deposition rates as high as 12 μm/h to 14 μm/h. These thick films had optical properties that closely matched the optical properties of films that were synthesized at lower deposition rates using lower methane concentrations, lower pressures and lower power densities. Comparable improvements are also obtainable with reactor designs and tuned deposition processes specific to single crystal diamond synthesis and nanocrystalline diamond synthesis.

The foregoing disclosure is provided in detail using the MPCVD of diamond as an example process application. However the techniques described can be employed for other microwave plasma assisted processing applications. Additionally, the disclosure is provided in the context of an internally tunable microwave plasma reactor as the example reactor. However, the disclosed apparatus and methods can be applied to other microwave reactor designs where the cylindrical, tunable applicator portion of the applicator is replaced by a standard fixed applicator.

Because other modifications and changes varied to fit particular operating requirements and environments will be apparent to those skilled in the art, the disclosure is not considered limited to the example chosen for purposes of illustration, and covers all changes and modifications which do not constitute departures from the true spirit and scope of this disclosure.

Accordingly, the foregoing description is given for clearness of understanding only, and no unnecessary limitations should be understood therefrom, as modifications within the scope of the disclosure may be apparent to those having ordinary skill in the art.

Throughout the specification, where the compositions, processes, or apparatus are described as including components, steps, or materials, it is contemplated that the compositions, processes, or apparatus can also comprise, consist essentially of, or consist of, any combination of the recited components or materials, unless described otherwise. Combinations of components are contemplated to include homogeneous and/or heterogeneous mixtures, as would be understood by a person of ordinary skill in the art in view of the foregoing disclosure. Disclosed limits and ranges are understood to encompass both precise and approximate boundaries.

REFERENCES

[1] M. Kamo, H. Yurimuto, Y. Sato, Appl. Surf. Sci. 33/44, 553 (1988).
[2] T. Teraji, Phys. Stat. Sol. (a) 203, 3324-3357 (2006).
[3] T. S. McCauley and Y. K. Vohra, Appl. Physics. Lett. 66, 1486 (1995).
[4] D. King, M. K. Yaran, T. Schuelke, T. A. Grotjohn, D. K. Reinhard and J. Asmussen, Diamond and Related Materials 17 (2008) 520-524.
[5] C.-S. Yan, Y. K. Vohra, H.-K. Mao, and R. L. Hemley, Proc. Natl. Acad. Sci. U.S.A. 99, 12523 (2002).
[6] K. P. Kuo and J. Asmussen, Diamond Relat. Mater. 6 (1997) 1097.
[7] Uwe Kahler, Microwave Plasma Diamond Film Growth, Diplomarbeit Thesis, Michigan State University and Gesamthochschule Wuppertal, 1997.
[8] Y. Mokuno, A. Chayahara, Y. Soda, Y. Horino, N. Fujimori, Diamond Relat. Mater. 14 (2005)1743.
[9] A. Tallaire, J. Acharda, F. Silvaa, R. S. Sussmanna, A. Gicquel, Diamond Relat. Mater. 14, (2005) 249.
[10] H. Stemschulte, T. Bauer, M. Schreck, B. Stritzker, Diamond Relat. Mater. 15 (2006) 542.
[11] H. Yamada, A. Chayahara, Y. Mokuno, S. Shikata, Diamond Relat. Mater. (2007).
[12] H. Yamada, A. Chayahara, Y. Mokuno, S. Shikata, Diamond Relat. Mater. 17 (2008) 1062.
[13] H. Yamada, A. Chayahara, Y. Mokuno, Y. Horino, S. Shikata, Diamond Relat. Mater. (2006).
[14] H. Yamada, A. Chayahara, Y. Mokuno, Y. Horino, S. Shikata, Diamond Relat. Mater. 15, (2006)1389.
[15] J. Asmussen, Keynote paper 11, presented at the 2nd Conference on New Diamond and Nano Carbons 2008 May 26-29th, Taipei, Taiwan; K. W. Hemawan, T. A. Grotjohn, D. K. Reinhard, J. Asmussen, invited paper presented at ICOPS 2008, Karlsruhe Germany June 2008; T Grotjohn, J. Asmussen invited paper presented at the International Workshop on Strong Microwaves, Russia, August 2008.
[16] F. Silva, K. Hassouni, A. Gicquel, X. Bonnin, invited paper presented at the International Workshop on Strong Microwaves, August 2008.
[17] J. Asmussen, R. Mallavarpu, J. R. Hamann, and H. C. Park, Proceed. IEEE, 62, (1974), 109.
[18] R. Mallavarpu, M. C. Hawley and J. Asmussen, IEEE Trans. On Plasma Sci., PS-6, (1978), 341.
[19] P. L. Kapitza, Soviet Physics JETP, 30 (1970) 973.
[20] K. P. Kuo, Ph.D. Dissertation, Michigan State University, 1997.
[21] S. S. Zuo et al. Diamond Relat. Mater. 17 (2008) 300.
[22] S. Whitehair, and J. Asmussen, J. Propulsion and Power, 3, (1987), 136-144.
[23] S. Offermans, Electrodless High-power Microwave Discharges, J Appl Phys. 67, 115 (1990).
[24] J Asmussen and D. K. Reinhard, Diamond Films Handbook, Chapter 7, Marcel Dekker, New York, 2002.
[25] J. E Brandenburg, J. Kline, D. Sulliven, IEEE Trans. On Plasma Science 33, 2, 776-782, pt2 April 2005.
[26] K. D. Diament, B. L. Ziegler, R. B. Cohen, J. of Propulsion and Power, 23, 27-34, January-February 2007.
[27] T. A. Grotjohn, J. Asmussen, J. Sivagnaname, D. Story, A. L. Vikharev, A. Gorbachev, A, Kolysko, Diamond Relat. Mater. 9 (2000) 322.
[28] A. L. Vikharev, A. M. Gorbachev, A. V. Kolysko, D. B. Radishev, and A. B. Muchnikov, Diamond Relat. Mater. 17 (2008) 1055.

What is claimed is:

1. A microwave plasma assisted reactor comprising:
(a) a first microwave chamber having a reference plane at a reference axial location $Z_0$, the first microwave chamber comprising an electromagnetic wave source and extending in an axial direction $z > Z_0$;
(b) a plasma chamber having an outer wall, the plasma chamber extending into the first microwave chamber such that at least a portion of the plasma chamber is located at $z > Z_0$ and at least a portion of the plasma chamber is located at $z < Z_0$;
(c) a conductive stage for supporting a substrate holder and having a reference surface extending into the plasma chamber and defining a second microwave chamber in the plasma chamber (i) at $z < Z_0$ and (ii) between the plasma chamber outer wall and the conductive stage;
(d) a conducting short adjustably disposed in the second microwave chamber below $Z_0$ and in electrical contact with the plasma chamber outer wall and the conductive stage, the axial distance between the conducting short and $Z_0$ being $L2$, and the axial distance between the conducting short and the reference surface of the conductive stage being $L1$;

wherein L2 and L1 are capable of adjustment in the reactor by moving the conducting short, such that different microwave modes are produced in the first microwave chamber and in the second microwave chamber during operation of the reactor.

2. The microwave plasma assisted reactor of claim 1, wherein during operation of the reactor, evanescent microwave fields are produced in the vicinity of $Z_0$, the evanescent microwave fields being distinct from the microwave modes in the first microwave chamber and in the second microwave chamber.

3. The microwave plasma assisted reactor of claim 1, wherein the conductive stage is movable such that both L1 and L2 are capable of independent adjustment during operation of the reactor by moving one or both of the conducting short and the conductive stage.

4. The microwave plasma assisted reactor of claim 1, wherein the conducting short is slidable in an axial direction.

5. The microwave plasma assisted reactor of claim 4, wherein the conductive stage is movable and slidable in the axial direction.

6. The microwave plasma assisted reactor of claim 1, wherein the first microwave chamber, the plasma chamber, and the conductive stage have cylindrical cross sections with radii of R1, R2, and R3, respectively.

7. The microwave plasma assisted reactor of claim 6, wherein R3/R2 is about 0.5 or less.

8. The microwave plasma assisted reactor of claim 1, wherein the reactor is capable of producing a plasma having a power density ranging from about 160 W/cm$^3$ to about 600 W/cm$^3$ in the plasma chamber when the electromagnetic wave source provides an excitation frequency of about 2.45 GHz and an operating pressure in the plasma chamber ranges from about 180 Torr to about 260 Torr.

9. The microwave plasma assisted reactor of claim 1, wherein:
(a) the electromagnetic wave source generates waves with an excitation frequency f;
(b) at least one of L1 and L2 is about one-half of a free space wavelength $\lambda_0$, where the free space wavelength $\lambda_0$, is given by the ratio c/f of the speed of light c relative to the excitation frequency f;
(c) the conductive stage is a coaxial conductive stage defining a coaxial microwave chamber as the second microwave chamber; and
(d) the conducting short is in electrical contact with a metal portion of the plasma chamber outer wall and the coaxial conductive stage.

10. A microwave plasma assisted reactor comprising:
(a) a cylindrical chamber defining an interior cylindrical microwave chamber of radius R1 and having (i) a central axis, (ii) a lower boundary at a reference axial location $Z_0$, and (iii) a upper boundary at an axial location $Z_u > Z_0$; and
(b) a base defining an interior base cavity of radius R2 and having (i) an upper boundary adjacent the cylindrical chamber at $Z_0$ and (ii) a lower portion extending axially downwardly in a direction $z < Z_0$;
(c) an upper conducting short in electrical contact with the cylindrical chamber and disposed in an upper portion of the cylindrical chamber at an axial distance $L_s$ above $Z_0$, the upper conducting short having a central opening and defining the upper boundary of the cylindrical chamber;
(d) an excitation probe extending through the central opening of the upper conducting short and into the upper portion of the cylindrical microwave chamber by an axial distance $L_p$ relative to the upper boundary of the cylindrical chamber;
(e) a coaxial stage for supporting a substrate holder and having a radius R3 and an upper surface extending at least into the base cavity and optionally into a bottom portion of the cylindrical microwave chamber, the coaxial stage defining a coaxial microwave chamber between R3 and R2 in the base cavity, wherein the coaxial stage is conductive;
(f) a lower conducting short adjustably disposed in the coaxial microwave chamber below $Z_0$ and in electrical contact with the base and the coaxial stage, the axial distance between the lower conducting short and $Z_0$ being L2 and the axial distance between the lower conducting short and the upper surface of the coaxial stage being L1;
(g) a quartz bell jar mounted on the base and defining a plasma chamber in the bottom portion of the cylindrical microwave chamber and the coaxial microwave chamber;
(h) a feed gas inlet in fluid connection with the plasma chamber; and,
(i) an effluent gas outlet in fluid connection with the plasma chamber; wherein
L2 and L1 are capable of adjustment in the reactor by moving the lower conducting short.

11. The microwave plasma assisted reactor of claim 10, wherein the coaxial stage is movable such that both L1 and L2 are capable of independent adjustment during operation of the reactor by moving one or both of the lower conducting short and the coaxial stage.

12. The microwave plasma assisted reactor of claim 10, wherein the lower conducting short has an annular disk shape and is slidable in an axial direction.

13. The microwave plasma assisted reactor of claim 12, wherein the coaxial stage is movable and slidable in the axial direction.

14. The microwave plasma assisted reactor of claim 10, further comprising:
(j) one or more shim inserts axially interposed between the base and the lower conducting short;
wherein the lower conducting short has a disk shape and is adjustably located in an axial direction based on the number and size of shim inserts interposed between the base and the lower conducting short.

15. The microwave plasma assisted reactor of claim 14, wherein both L1 and L2 are capable of independent adjustment in the reactor by independently selecting the number of shim inserts and the axial height of the coaxial stage.

16. The microwave plasma assisted reactor of claim 10, wherein at least one of the upper conducting short and the excitation probe is movable and capable of adjustment during operation of the reactor.

17. The microwave plasma assisted reactor of claim 16, wherein the upper conducting short and the excitation probe are slidable and capable of independent adjustment during operation of the reactor.

18. The microwave plasma assisted reactor of claim 10, wherein R3/R2 is about 0.5 or less.

19. The microwave plasma assisted reactor of claim 10, wherein the excitation probe generates waves with an excitation frequency of about 2.45 GHz.

20. The microwave plasma assisted reactor of claim 19, wherein:
R1 ranges from about 6 cm to about 16 cm;
R2 ranges from about 5 cm to about 12 cm;

R3 ranges from about 0.5 cm to about 7 cm;
Ls ranges from about 15 cm to about 25 cm;
Lp ranges from about 2 cm to about 5 cm; and,
L1 and L2 independently range from about 4 cm to about 8 cm.

21. The microwave plasma assisted reactor of claim 20, wherein:
R1 is about 8.9 cm;
R2 is about 7.0 cm; and,
R3 is selected from about 0.95 cm, about 1.9 cm, and about 4.1 cm.

22. A reactor kit comprising the microwave plasma assisted reactor of claim 10 and at least one of:
   (a) a plurality of cylindrical chambers, each defining an interior cylindrical microwave chamber of a different radius R1;
   (b) a plurality of bases, each defining an interior base cavity of a different radius R2; and,
   (c) a plurality of coaxial stages, each having a different radius R3;
   wherein the reactor can be assembled with any combination of the cylindrical chambers, the bases, and the coaxial stages such that at least one of R1, R2, and R3 can be varied in a selected reactor assembly.

23. The microwave plasma assisted reactor of claim 10, wherein:
   (a) the excitation probe generates electromagnetic waves with an excitation frequency f;
   (b) at least one of L1 and L2 is about one-half of a free space wavelength $\lambda_0$, where the free space wavelength $\lambda_0$, is given by the ratio c/f of the speed of light c relative to the excitation frequency f; and
   (c) the lower conducting short is in electrical contact with a metal portion of the base and the coaxial conductive stage.

* * * * *